(12) United States Patent
Fukushima

(10) Patent No.: US 11,846,681 B2
(45) Date of Patent: Dec. 19, 2023

(54) ESTIMATION APPARATUS AND ESTIMATION METHOD

(71) Applicant: GS Yuasa International Ltd., Kyoto (JP)

(72) Inventor: Atsushi Fukushima, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 121 days.

(21) Appl. No.: 17/602,195

(22) PCT Filed: Apr. 17, 2020

(86) PCT No.: PCT/JP2020/016861
§ 371 (c)(1),
(2) Date: Oct. 7, 2021

(87) PCT Pub. No.: WO2020/218184
PCT Pub. Date: Oct. 29, 2020

(65) Prior Publication Data
US 2022/0179010 A1 Jun. 9, 2022

(30) Foreign Application Priority Data
Apr. 26, 2019 (JP) .................. 2019-085683

(51) Int. Cl.
*G01R 31/392* (2019.01)
*G01R 31/389* (2019.01)
(Continued)

(52) U.S. Cl.
CPC ......... *G01R 31/392* (2019.01); *G01R 31/367* (2019.01); *G01R 31/374* (2019.01);
(Continued)

(58) Field of Classification Search
None
See application file for complete search history.

(56) References Cited

U.S. PATENT DOCUMENTS

2012/0310571 A1  12/2012  Takagi
2015/0301118 A1  10/2015  Tao et al.
(Continued)

FOREIGN PATENT DOCUMENTS

JP  WO2011/135609 A1  7/2013
JP  2013-253991 A  12/2013
(Continued)

OTHER PUBLICATIONS

International Search Report (ISR) (PCT Form PCT/ISA/210), in PCT/JP2020/016861, dated Jul. 28, 2020.

Primary Examiner — Jas A Sanghera
(74) Attorney, Agent, or Firm — MCGINN I.P. LAW GROUP, PLLC

(57) ABSTRACT

An estimation apparatus that estimates a degradation amount of an energy storage device includes: a storage unit; and an arithmetic processing unit. The energy storage device has a characteristic of including a first degradation area in which a temporal transition of a degradation amount shows a first transition and a second degradation area in which the temporal transition of the degradation amount shows a second transition. The storage unit holds first arithmetic data for calculating the degradation amount in the first degradation area, and second arithmetic data for calculating the degradation amount in the second degradation area. The arithmetic processing unit executes determination processing of determining a degradation area of the energy storage device, and estimation processing of selecting arithmetic data corresponding to the degradation area from the storage unit to estimate the degradation amount of the energy storage device.

4 Claims, 24 Drawing Sheets

(51) Int. Cl.
    *G01R 31/3842*  (2019.01)
    *G01R 31/367*   (2019.01)
    *G01R 31/374*   (2019.01)
    *H01M 10/48*    (2006.01)

(52) U.S. Cl.
    CPC ....... *G01R 31/389* (2019.01); *G01R 31/3842* (2019.01); *H01M 10/48* (2013.01)

(56) References Cited

U.S. PATENT DOCUMENTS

| | | |
|---|---|---|
| 2016/0011274 A1 | 1/2016 | Morita et al. |
| 2016/0375790 A1 | 12/2016 | Komiyama |
| 2017/0123013 A1 | 5/2017 | Tao et al. |
| 2017/0285110 A1* | 10/2017 | Inoue .................. G01R 31/367 |
| 2018/0156873 A1 | 6/2018 | Matsuyama et al. |
| 2018/0246174 A1 | 8/2018 | Shimosawa et al. |
| 2019/0317155 A1 | 10/2019 | Inoue et al. |
| 2020/0033415 A1 | 1/2020 | Furukawa et al. |
| 2021/0263086 A1 | 8/2021 | Fukushima |

FOREIGN PATENT DOCUMENTS

| | | |
|---|---|---|
| JP | 5382208 B2 | 1/2014 |
| JP | 2014-190763 A | 10/2014 |
| JP | 2016-006404 A | 1/2016 |
| JP | 2017-009540 A | 1/2017 |
| JP | 2017-187462 A | 10/2017 |
| JP | WO2016/194082 A1 | 3/2018 |
| JP | WO2017/033311 A1 | 7/2018 |
| JP | WO2018/062394 A1 | 8/2019 |
| JP | WO2018/117105 A1 | 11/2019 |
| JP | WO2020/021944 A1 | 8/2021 |

* cited by examiner

| Decrease amount Y of actual capacity C per unit time [Ah/month] | | Temperature [°C] | | |
|---|---|---|---|---|
| | | 0 | 25 | 50 |
| Division area | E1 (Total decrease amount: 0-3 Ah) | 0.5241 | 2.3623 | 8.4343 |
| | E2 (Total decrease amount: 3-6 Ah) | 0.1747 | 0.7874 | 2.8114 |
| | E3 (Total decrease amount: 6-9 Ah) | 0.1048 | 0.4725 | 1.6869 |

| Period (month) | Temperature [°C] |
|---|---|
| 1 | 0 |
| 2 | 25 |
| 3 | 25 |
| 4 | 25 |
| 5 | 50 |

| Transitional condition | | Decrease amount Y [Ah] | Total decrease amount ΣY [Ah] | Total decrease amount range |
|---|---|---|---|---|
| Period [month] | Temperature [°C] | | | |
| 0 | - | - | 0.00 | E1 (0~3Ah) |
| 1 | 0 | 0.5241 | 0.5241 | E1 (0~3Ah) |
| 2 | 25 | 2.3623 | 2.8864 | E1 (0~3Ah) |
| 3 | 25 | 2.3623 | 5.2487 | E2 (3~6Ah) |
| 4 | 25 | 0.7874 | 6.0361 | E3 (6~9Ah) |
| 5 | 50 | 1.6869 | 7.7230 | E3 (6~9Ah) |

Fig. 14

| Temperature [°C] | Coefficient |
|---|---|
| 15 | k1 |
| 20 | k2 |
| 25 | 1 |
| 30 | k3 |
| 35 | k4 |
| 40 | k5 |
| 45 | k6 |
| 50 | k7 |
| 55 | k8 |
| 60 | k9 |

Fig. 16

| Range of total decrease amount $\Sigma Y$ | Corresponding approximate line | Slope d |
|---|---|---|
| $0 \leqq \Sigma Y < e1$ | D1 | d1 |
| $e1 \leqq \Sigma Y < e2$ | D2 | d2 |
| $e2 \leqq \Sigma Y < e3$ | D3 | d3 |

Fig. 20A

| Range of total decrease amount ΣY | Corresponding approximate line | Slope d |
|---|---|---|
| $0 \leq \Sigma Y < e1$ | D1 | d1 |
| $e1 \leq \Sigma Y < e2$ | D2 | d2 |
| $e2 \leq \Sigma Y < e3$ | D3 | d3 |

Fig. 20B

| Range of total decrease amount ΣY | Corresponding approximate line | Slope d |
|---|---|---|
| $e3 \leq \Sigma Y < e4$ | D4 | d4 |
| $e4 \leq \Sigma Y < e5$ | D5 | d5 |

Fig. 21A

| Temperature [°C] | Coefficient kA |
|---|---|
| 15 | k1 |
| 20 | k2 |
| 25 | 1 |
| 30 | k3 |
| 35 | k4 |
| 40 | k5 |
| 45 | k6 |
| 50 | k7 |
| 55 | k8 |
| 60 | k9 |

Fig. 21B

| Temperature [°C] | Coefficient kB |
|---|---|
| 15 | k11 |
| 20 | k12 |
| 25 | 1 |
| 30 | k13 |
| 35 | k14 |
| 40 | k15 |
| 45 | k16 |
| 50 | k17 |
| 55 | k18 |
| 60 | k19 |

US 11,846,681 B2

ESTIMATION APPARATUS AND ESTIMATION METHOD

TECHNICAL FIELD

The present invention relates to a technique for estimating a degradation amount of an energy storage device.

BACKGROUND ART

It is known that actual capacity of a secondary battery decreases from an initial value with the lapse of time. It is not easy to measure the actual capacity of the battery during use, and it has been required to estimate the actual capacity by using a measurable parameter. The main factors of the decrease in the actual capacity of the battery include cycle degradation due to repeated charge and discharge and time degradation due to the lapse of time after manufacturing. As a method for estimating the actual capacity due to time degradation, there is an estimation method using the root law and the Arrhenius law. The root law is a law in which the actual capacity decreases in accordance with the root of the elapsed time. Patent Document 1 below discloses a technique for estimating a degradation rate of a battery by using the root law. The Arrhenius law is a law that the degree of decrease in actual capacity varies depending on the temperature.

PRIOR ART DOCUMENT

Patent Document

Patent Document 1: JP 5382208 B2

SUMMARY OF THE INVENTION

Problems to be Solved by the Invention

An energy storage device may have a first degradation area in which a temporal transition of a degradation amount shows a first transition and a second degradation area in which the temporal transition of the degradation amount shows a second transition. When the degradation amount is estimated without considering a change in the transition of the degradation amount, estimation accuracy of the degradation amount may decrease.

An object of the present technique is to improve estimation accuracy of a degradation amount of an energy storage device.

Means for Solving the Problems

An estimation apparatus according to one aspect includes: a storage unit; and an arithmetic processing unit. The energy storage device has a characteristic of including a first degradation area in which a temporal transition of a degradation amount shows a first transition and a second degradation area in which the temporal transition of the degradation amount shows a second transition. The storage unit holds first arithmetic data for calculating the degradation amount of the energy storage device in the first degradation area, and second arithmetic data for calculating the degradation amount of the energy storage device in the second degradation area. The arithmetic processing unit executes determination processing of determining a degradation area of the energy storage device, and estimation processing of selecting arithmetic data corresponding to the degradation area from the storage unit to estimate the degradation amount of the energy storage device.

The present technique can be applied to an energy storage apparatus. The present technique is applicable to an estimation method for a degradation amount of an energy storage device, an estimation program for the degradation amount, and a recording medium storing the estimation program.

Advantages of the Invention

The estimation accuracy of the degradation amount of the energy storage device can be improved.

BRIEF DESCRIPTION OF THE DRAWINGS

FIG. 14 is a coefficient table.
FIG. 16 is a graph showing slope data of each approximate line.
FIG. 20A is first approximation data.
FIG. 20B is second approximation data.
FIG. 21A is first approximation data.
FIG. 21B is second approximation data.

MODE FOR CARRYING OUT THE INVENTION

Summary of Present Embodiment

Figure 1:
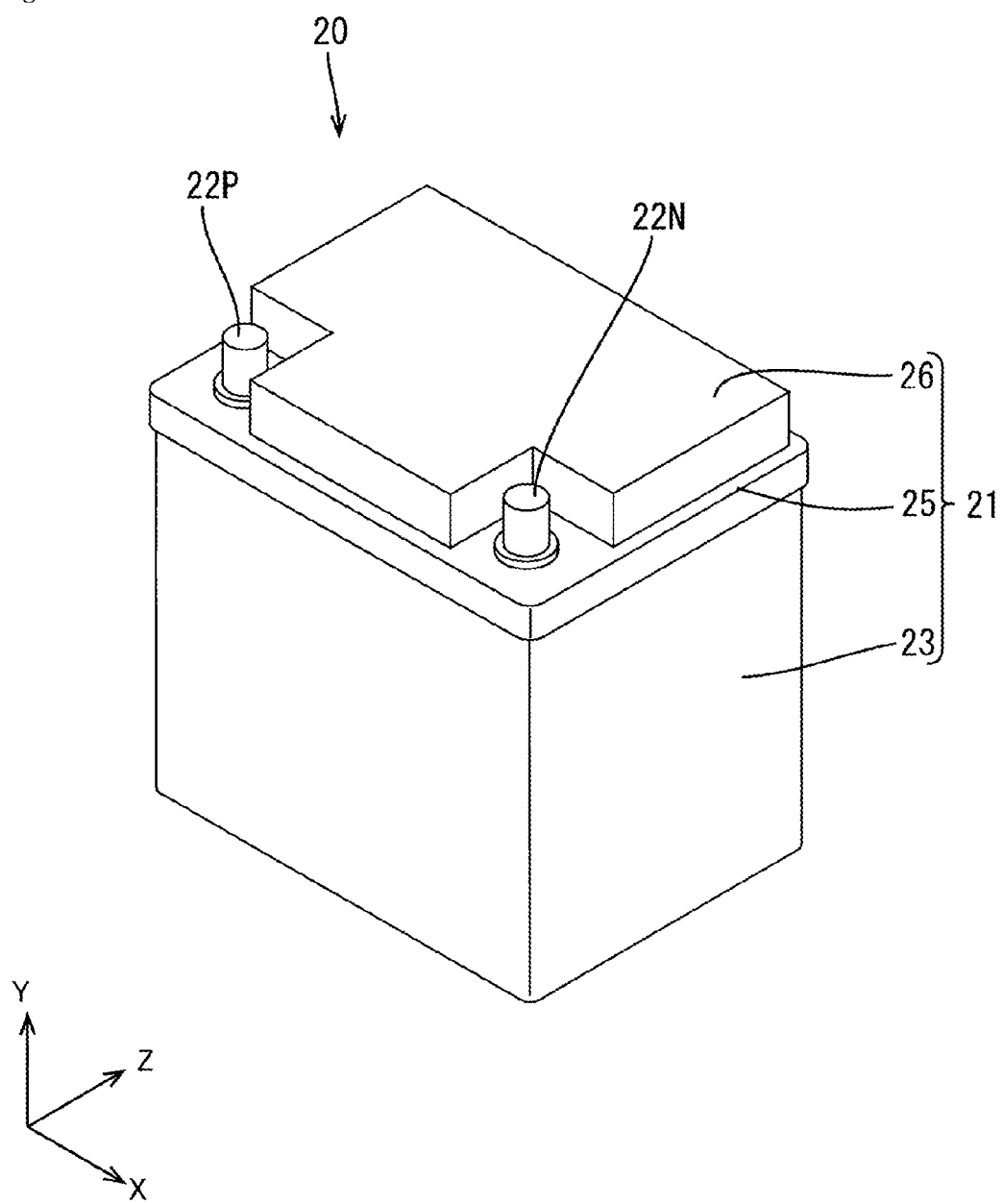
FIG. 1 is a perspective view of a battery.

An estimation apparatus includes: a storage unit; and an arithmetic processing unit. The energy storage device has a characteristic of including a first degradation area in which a temporal transition of a degradation amount shows a first transition and a second degradation area in which the temporal transition of the degradation amount shows a second transition. The storage unit holds first arithmetic data for calculating the degradation amount of the energy storage device in the first degradation area, and second arithmetic data for calculating the degradation amount of the energy storage device in the second degradation area. The arithmetic processing unit executes determination processing of determining a degradation area of the energy storage device, and estimation processing of selecting arithmetic data corresponding to the degradation area from the storage unit to estimate the degradation amount of the energy storage device.

As an estimation method for a degradation amount of an energy storage device, the root law is known. The root law is a law in which the degradation amount of the energy storage device decreases in accordance with the root of the elapsed time. There has been an estimation error in the estimation of the degradation amount by the root law. In order to identify the factor of the estimation error, the inventors have focused on how the degradation amount of the energy storage device changes with the lapse of time. Then, the present inventors have found that the temporal transition of the degradation amount includes the first degradation area indicating the first transition and the second degradation area indicating the second transition. The estimation apparatus determines the degradation area and selects the arithmetic data and can thus perform degradation estimation in accordance with the degradation area. Hence it is possible to reduce the estimation error of the degradation amount due to the difference in degradation area, thereby enhancing estimation accuracy of the degradation amount of the energy storage device.

The storage unit may hold first correction data for performing temperature correction on the degradation amount of the energy storage device in the first degradation area, and second correction data for performing temperature correction on the degradation amount of the energy storage device in the second degradation area, and the arithmetic processing unit may select correction data corresponding to the degradation area from the storage unit to correct the degradation amount of the energy storage device. By performing the temperature correction, it is possible to reduce the estimation error of the degradation amount due to the difference in temperature. With the correction data being held for each degradation area, the correction can be performed with high accuracy.

The first correction data may be a coefficient table for performing temperature correction on the elapsed time of the energy storage device in the first degradation area. The second correction data may be a coefficient table for performing temperature correction on the elapsed time of the energy storage device in the second degradation area. By correcting the elapsed time in accordance with the temperature, the estimation error of the degradation amount can be reduced.

The storage unit may hold correlation data indicating a correlation between a capacity change rate and a resistance change rate of the energy storage device, and the arithmetic processing unit may estimate one of the capacity change rate and the resistance change rate based on the first arithmetic data and the second arithmetic data and estimate the other of the capacity change rate and the resistance change rate from the correlation data. By estimating the capacity and the resistance, it is possible to accurately determine a degradation state of the energy storage device.

First Embodiment

A first embodiment will be described with reference to FIGS. 1 to 22.

1. Description of Battery

Figure 2:
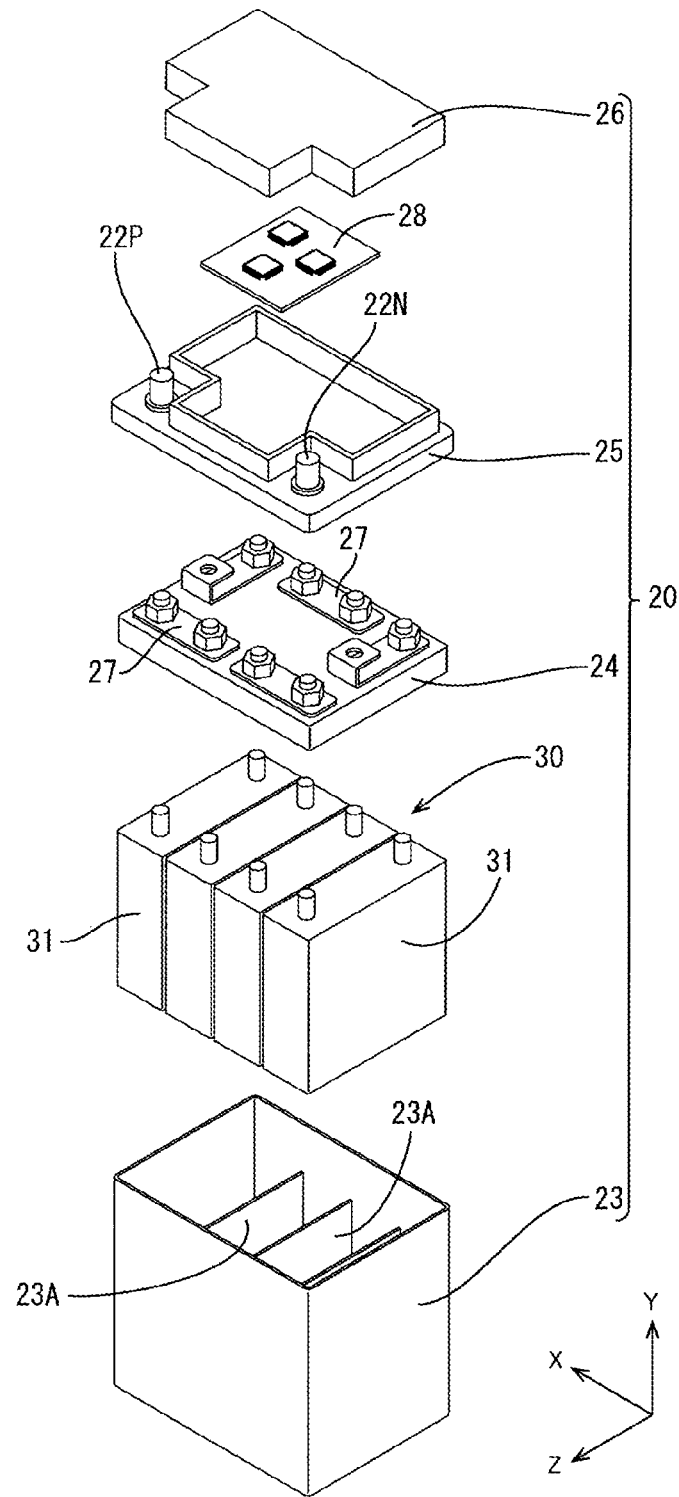
FIG. 2 is an exploded perspective view of the battery.
Figure 3:
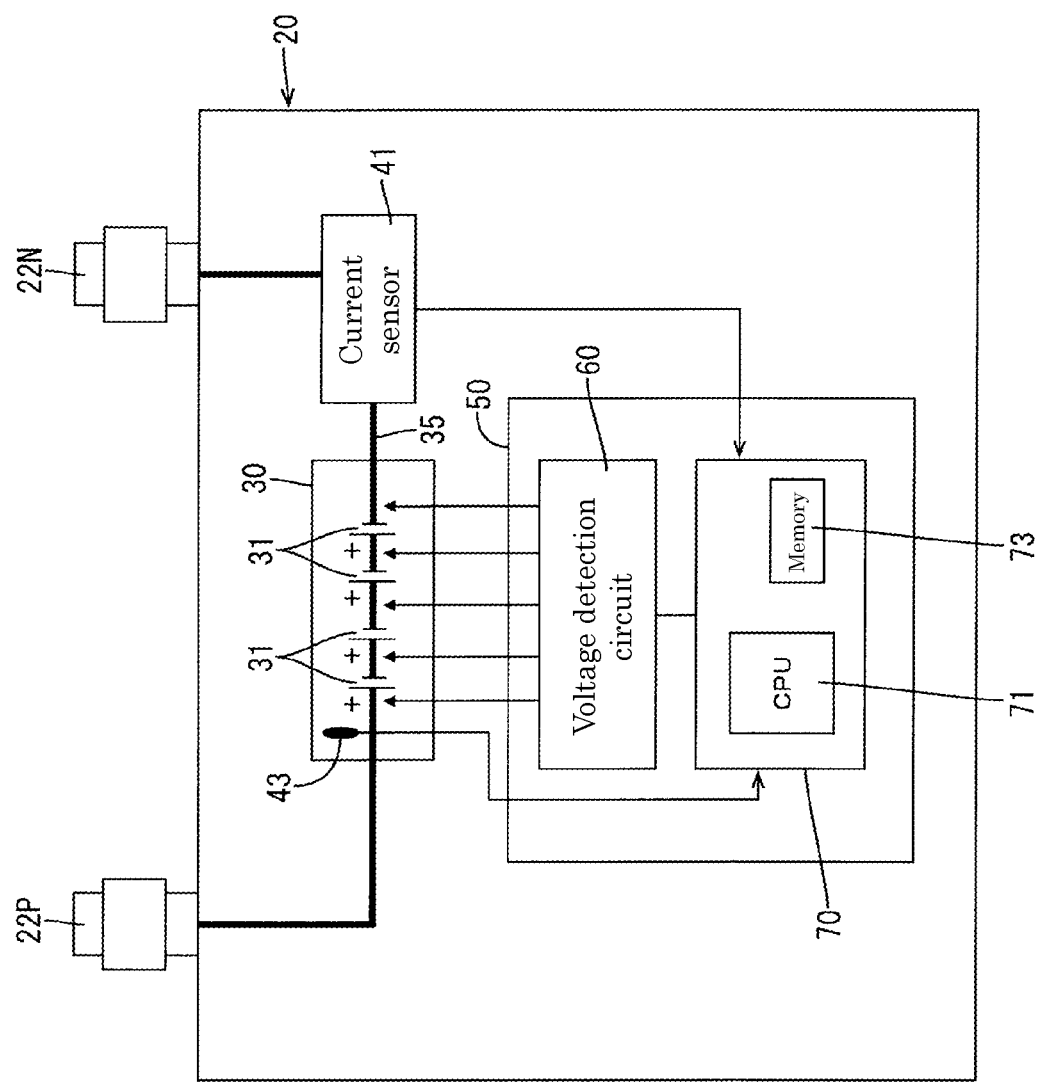
FIG. 3 is a block diagram of the battery.

FIG. 1 is a perspective view of a battery, FIG. 2 is an exploded perspective view of the battery, and FIG. 3 is a block diagram showing an electrical configuration of the battery. A battery 20 is an energy storage apparatus.

As shown in FIG. 1, the battery 20 has a block-shaped battery case 21, and an assembled battery 30 made up of a plurality of secondary batteries 31 and a control board 28 are housed in the battery case 21. In the following description, in the case of referring to FIGS. 1 and 2, the vertical direction of the battery case 21 when the battery case 21 is placed horizontally without being inclined with respect to an installation surface is the Y-direction, a direction along the direction of the long side of the battery case 21 is the X-direction, and the depth direction of the battery case 21 is the Z-direction.

As shown in FIG. 2, the battery case 21 includes a box-shaped case body 23 that opens upward, a positioning member 24 that positions the plurality of secondary batteries 31, an inner lid 25 attached to an upper portion of the case body 23, and an upper lid 26 attached to the upper portion of the inner lid 25. As shown in FIG. 2, in the case body 23, a plurality of cell chambers 23A, in which the secondary batteries 31 are individually housed, are provided side by side in the X-direction.

As shown in FIG. 2, in the positioning member 24, a plurality of busbars 27 are arranged on an upper surface, and the positioning member 24 is disposed above the plurality of secondary batteries 31 arranged in the case body 23, so that the plurality of secondary batteries 31 are positioned and connected in series by the plurality of busbars 27.

As shown in FIG. 1, the inner lid 25 has a substantially rectangular shape in a plan view and has a shape with a height difference in the Y-direction. A pair of terminal portion 22P and terminal portion 22N, to which harness terminals (not illustrated) are connected, are provided at both ends of the inner lid 25 in the X-direction. The pair of terminal portion 22P and terminal portion 22N are made of, for example, a metal such as a lead alloy 22P is a positive side terminal portion, and 22N is a negative side terminal portion.

As shown in FIG. 2, the control board 28 can be housed inside the inner lid 25, and the secondary battery 31 and the control board 28 are connected by attaching the inner lid 25 to the case body 23.

Next, an electrical configuration of the battery 20 will be described with reference to FIG. 3. The battery 20 includes the assembled battery 30, a current sensor 41, a temperature sensor 43, and a battery management apparatus (hereinafter, BM) 50 that manages the assembled battery 30. The assembled battery 30 is made up of the plurality of secondary batteries 31 connected in series. The secondary battery 31 is an energy storage device.

The current sensor 41 is connected in series with the assembled battery 30 via a connection line 35. The current sensor 41 is provided inside the battery case 21 and functions to detect a current flowing through the secondary battery 31. The temperature sensor 43 is a contact type or a non-contact type and functions to measure the temperature [° C.] of the secondary battery 31.

The current sensor 41 and the temperature sensor 43 are electrically connected to the BM 50 by signal lines, and detection values of the current sensor 41 and the temperature sensor 43 are taken into the BM 50. The current sensor 41 is provided in the battery case 21.

The BM 50 includes a voltage detection circuit 60 and a control unit 70 and is provided on the control board 28. A power supply line (not shown) of the BM 50 is connected to the assembled battery 30, and the BM 50 receives a power supply from the assembled battery 30. The BM 50 is an estimation apparatus that estimates the degradation amount of the battery 20.

The voltage detection circuit 60 is connected to both ends of each of the secondary batteries 31 via detection lines and functions to measure a voltage of each secondary battery 31 and a total voltage of the assembled battery 30 in response to an instruction from the control unit 70.

The control unit 70 includes a CPU 71, which is a central processing unit, and a memory 73. The CPU 71 is an arithmetic processing unit. The CPU 71, the CPU 71 monitors the current, the voltage, and the temperature of the secondary battery 31 from the outputs of the current sensor 41, the voltage detection circuit 60, and the temperature sensor 43. Further, as will be described later, a total decrease $\Sigma Y$ of actual capacity C of the lithium ion secondary battery 31 is estimated.

The memory 73 is a storage unit. The memory 73 is non-volatile, such as flash memory or an electrically erasable programmable read-only memory (EEPROM). A monitoring program for monitoring the secondary battery 31 and data necessary for executing the program are stored in the memory 73. In addition, data of a capacity decrease amount map MA for estimating the total decrease amount $\Sigma Y$ of the actual capacity C of the secondary battery 31 is stored.

2. Linear Approximation of Capacity Change Curve

The "actual capacity C" is a capacity that can be taken out from the fully charged state of the secondary battery. The main factors of the decrease in the actual capacity C of the secondary battery include cycle degradation due to repeated charge and discharge, and time degradation due to elapsed time after manufacturing.

Regarding the time degradation, there is an estimation method using the root law. The root law is a law in which the actual capacity C changes in accordance with the root of an elapsed time T. The "elapsed time T" is a time that has elapsed since the battery was manufactured.

Figure 4:
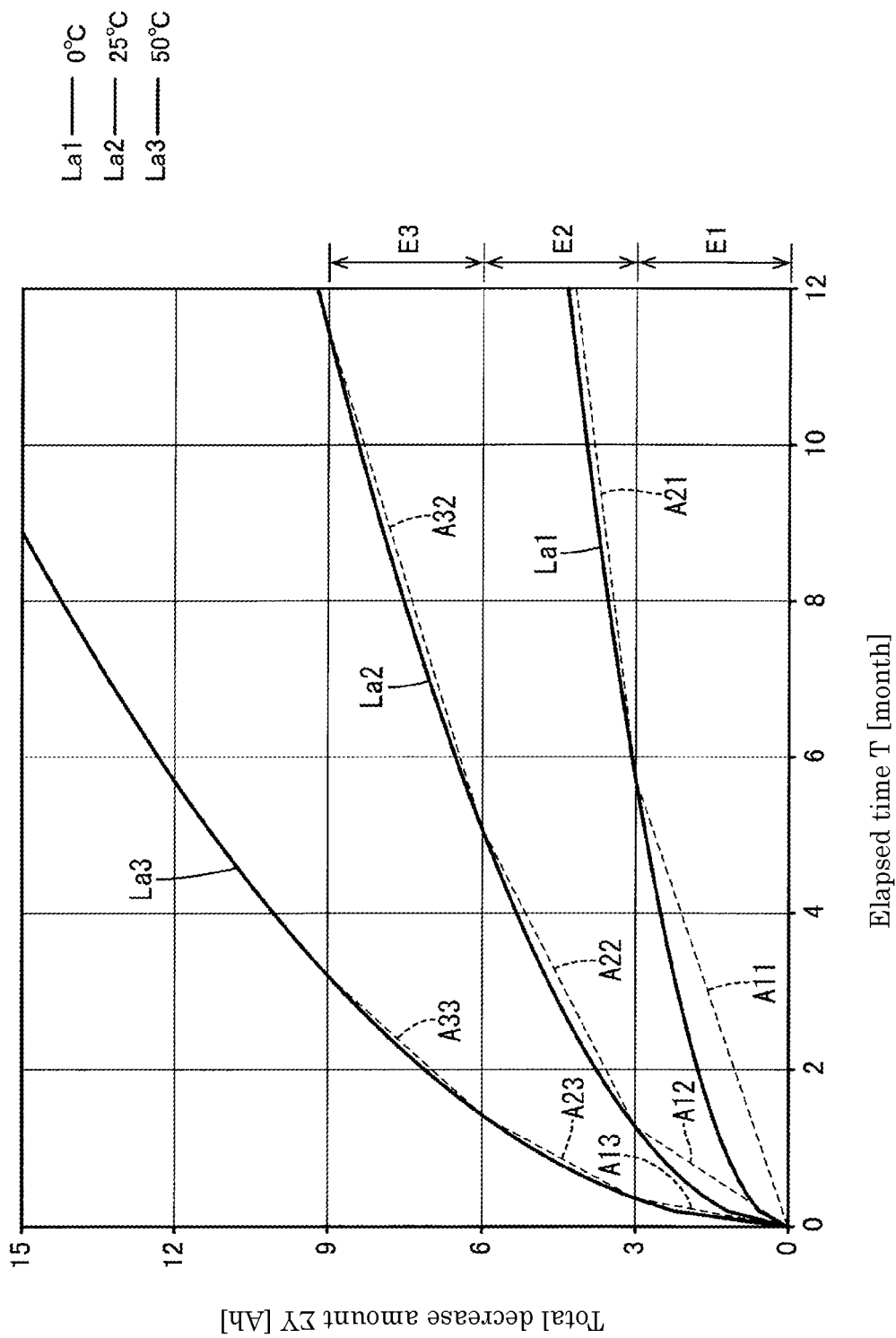
FIG. 4 is a capacity change curve of a secondary battery.
Figure 5:
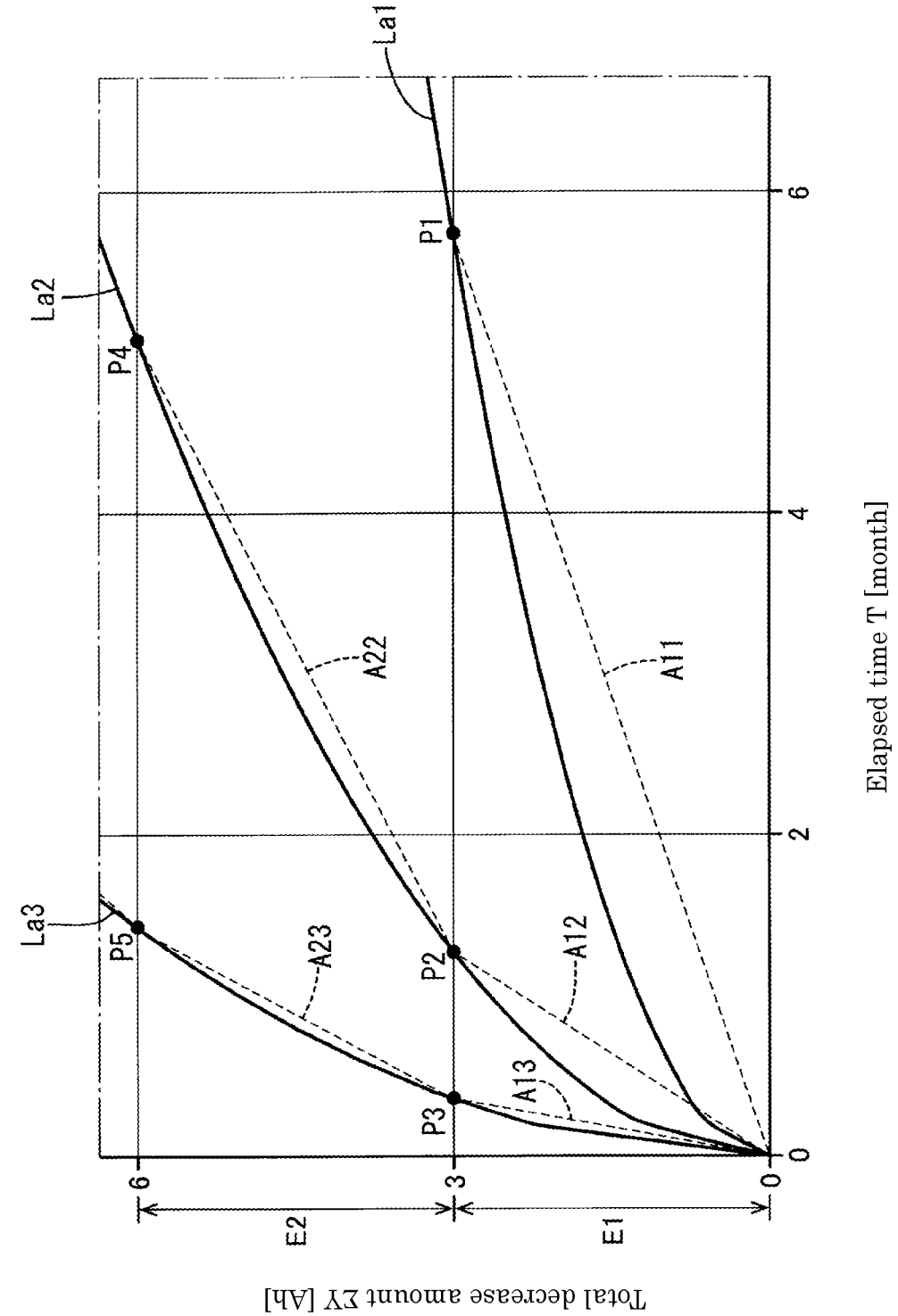
FIG. 5 is an enlarged view of a part of FIG. 4.

FIG. 4 is a T-$\Sigma Y$ correlation graph with the elapsed time T on the horizontal axis (X-axis) and the total decrease amount $\Sigma Y$ of the actual capacity C on the vertical axis (Y-axis). A capacity change curve La indicates a transition of the total decrease amount $\Sigma Y$ of the actual capacity C with respect to the elapsed time T. The capacity change curve La is a root curve with respect to the elapsed time T.

La1 is a capacity change curve with a battery temperature of 0 [° C.], La2 is a capacity change curve with a battery temperature of 25 [° C.], and La3 is a capacity change curve with a battery temperature of 50 [° C.].

The capacity change curve La is obtained by conducting an experiment for examining the transition of the total decrease amount $\Sigma Y$ of the actual capacity C with the lapse of time after the manufacturing of the lithium ion secondary battery 31 at each battery temperature. The lithium ion secondary battery 31 is an iron phosphate-based battery using lithium iron phosphate (LiFePO4) as a positive active material and graphite as a negative active material.

Three straight lines A11 to A31 are straight lines that approximate the capacity change curve La1 by dividing the capacity change curve La1 into three areas E1 to E3.

Three straight lines A12 to A32 are straight lines that approximate the capacity change curve La2 by dividing the capacity change curve La2 into the three areas E1 to E3.

Three straight lines A13 to A33 are straight lines that approximate the capacity change curve La3 by dividing the capacity change curve La3 into the three areas E1 to E3.

3. Estimation Processing for Capacity Decrease Amount Map MA and Total Decrease Amount $\Sigma Y$ The slopes of the straight lines A1 to A3 dividing the capacity change curve La each indicate a decrease amount Y of the actual capacity C per unit time (per month in the present example).

Figures 6, 7:
FIG. 6 is a capacity decrease amount map MA.
FIG. 7 is temperature data of the secondary battery.

As shown in FIG. 6, the capacity decrease amount map MA is data in which the decrease amount Y of the actual capacity C per unit time is stored for each of the areas E1 to E3 dividing the capacity change curve La and for each of the battery temperatures. For example, in the case of the battery temperature of 25 [° C.], the decrease amounts Y of the actual capacity C per unit time are 2.3623 [Ah/month], 0.7874 [Ah/month], and 0.4725 [Ah/month] for the areas E1 to E3, respectively, and these numerical values are the magnitudes of the slopes of the three straight lines A12, A22, A32 that approximate the capacity change curve La2.

The battery 20 holds data of the capacity decrease amount map MA in the memory 73 of the BM 50. The CPU 71 performs processing of estimating the total decrease amount $\Sigma Y$ of the actual capacity C based on temperature data of the lithium ion secondary battery 31 and the capacity decrease amount map MA (see FIG. 8).

The estimation processing for the total decrease amount $\Sigma Y$ is made up of processing of S10 to S30, and in S10, the processing of calculating the average temperature of the lithium ion secondary battery 31 per predetermined time (one month as an example) based on the output of the temperature sensor 43 performed every time predetermined time (one month as an example) elapses after the manufacturing of the battery.

In S20, the decrease amount Y of the actual capacity C of the lithium ion secondary battery 31 per predetermined time (one month as an example) is calculated based on the battery temperature data and the capacity decrease amount map MA.

In S30, a current value of the total decrease amount $\Sigma Y$ can be calculated by adding the decrease amount Y of the actual capacity C per predetermined time (one month as an example), calculated from the battery temperature data and the capacity decrease amount map MA, to a previous value of the total decrease amount $\Sigma Y$.

Immediately after the manufacturing of the battery, the total decrease amount $\Sigma Y$ of the actual capacity C is 0 [Ah], and the division of the total decrease amount $\Sigma Y$ of the secondary batteries 31 is included in the area E1.

Figures 8, 9:
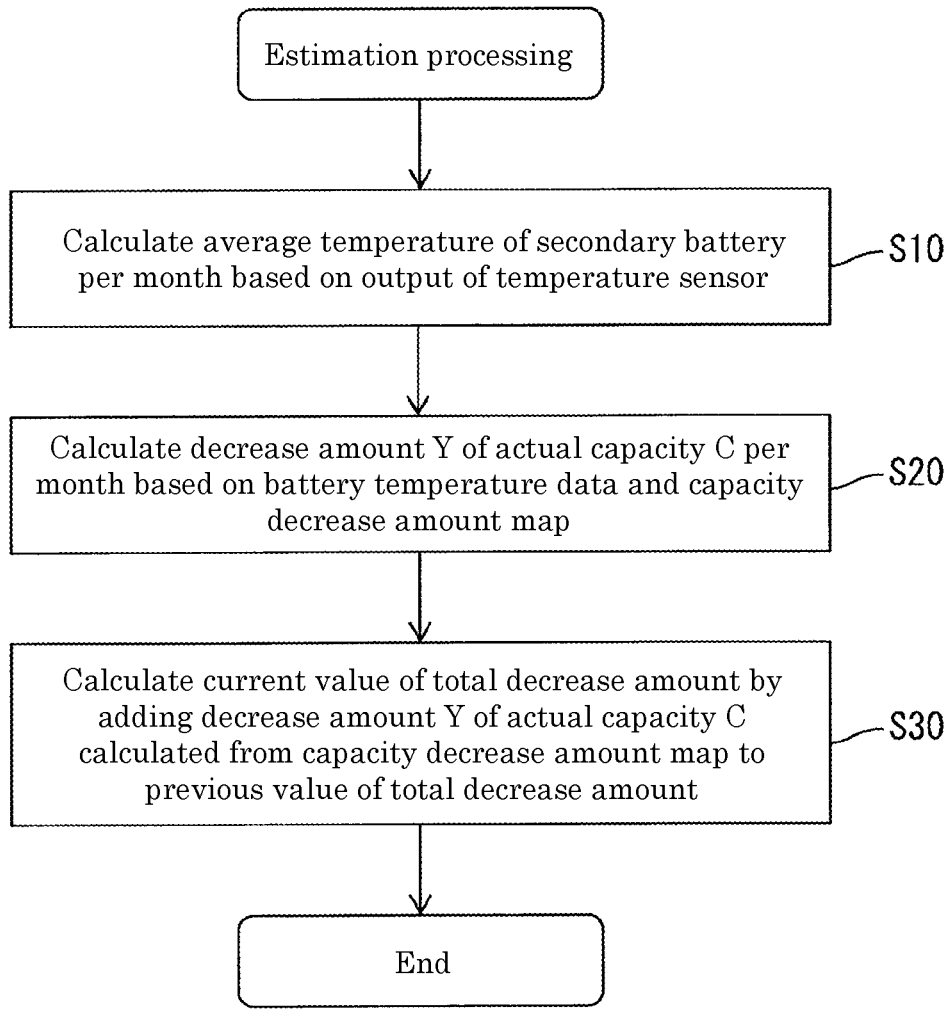
FIG. 8 is a flowchart showing estimation processing for a total decrease amount of actual capacity of the secondary battery.
FIG. 9 is an estimation example of the total decrease amount of the actual capacity of the secondary battery.

FIG. 7 shows the average temperature of the secondary battery 31 in each month after the battery manufacturing, and the average temperature in the first month is 0 [° C.]. Thus, the decrease amount of the actual capacity C per month is 0.5241 [Ah/month]. The total decrease amount $\Sigma Y$ of the actual capacity C at the point in time when one month has elapsed since the manufacturing of the battery is 0.5241 [Ah] as shown in FIG. 9.

In the case where the total decrease amount $\Sigma Y$ of the actual capacity C at the point in time when one month has elapsed since the manufacturing of the battery is 0.5241

[Ah], the division of the total decrease amount ΣY of the secondary battery 31 is included in the area E1 (0 to 3 [Ah]).

In the example of FIG. 7, the average temperature at the second month after the manufacturing of the battery is 25 [° C.]. Thus, the decrease amount of the actual capacity C at the second month after the manufacturing of the battery is 2.3623 [Ah/month]. The total decrease amount ΣY of the actual capacity C at the point in time when two months elapse after the manufacturing of the battery is 0.5241 [Ah]+2.3623 [Ah], which is 2.8864 [Ah] as shown in FIG. 9.

In the case where the total decrease amount ΣY of the actual capacity C at the point in time when two months have elapsed since the manufacturing of the battery is 2.8864 [Ah], the division of the total decrease amount ΣY of the secondary battery 31 is included in the area E1 (0 to 3 [Ah]).

In the example of FIG. 7, the average temperature at the third month after the manufacturing of the battery is 25 [° C.]. For the third month after the manufacturing of the battery the decrease amount Y of the actual capacity C per month is 2.3623 [Ah/month]. The total decrease amount ΣY of the actual capacity C at the point in time when three months have elapsed since the manufacturing of the battery is 2.8864 [Ah]+2.3623 [Ah], which is 5.2487 [Ah] as shown in FIG. 9.

In the case where the total decrease amount ΣY of the actual capacity C at the point in time when three months have elapsed since the manufacturing of the battery is 5.2487[Ah], the division of the total decrease amount ΣY of the secondary battery 31 is included in the area E2 (3 to 6 [Ah]).

In the example of FIG. 7, the average temperature at the fourth month after the manufacturing of the battery is 25 [° C.]. For the fourth month after the manufacturing of the battery the decrease amount Y of the actual capacity C per month is 0.7874 [Ah/month]. The total decrease amount ΣY of the actual capacity C at the point in time when four months elapse after the manufacturing of the battery is 5.2487 [Ah]+0.7874 [Ah], which is 6.0361 [Ah] as shown in FIG. 9.

As described above, the current value of the total decrease amount ΣY of the actual capacity C can be obtained by adding the decrease amount of the actual capacity C per month, obtained from the capacity decrease amount map MA, to the total decrease amount ΣY up to the previous month.

Figure 10:
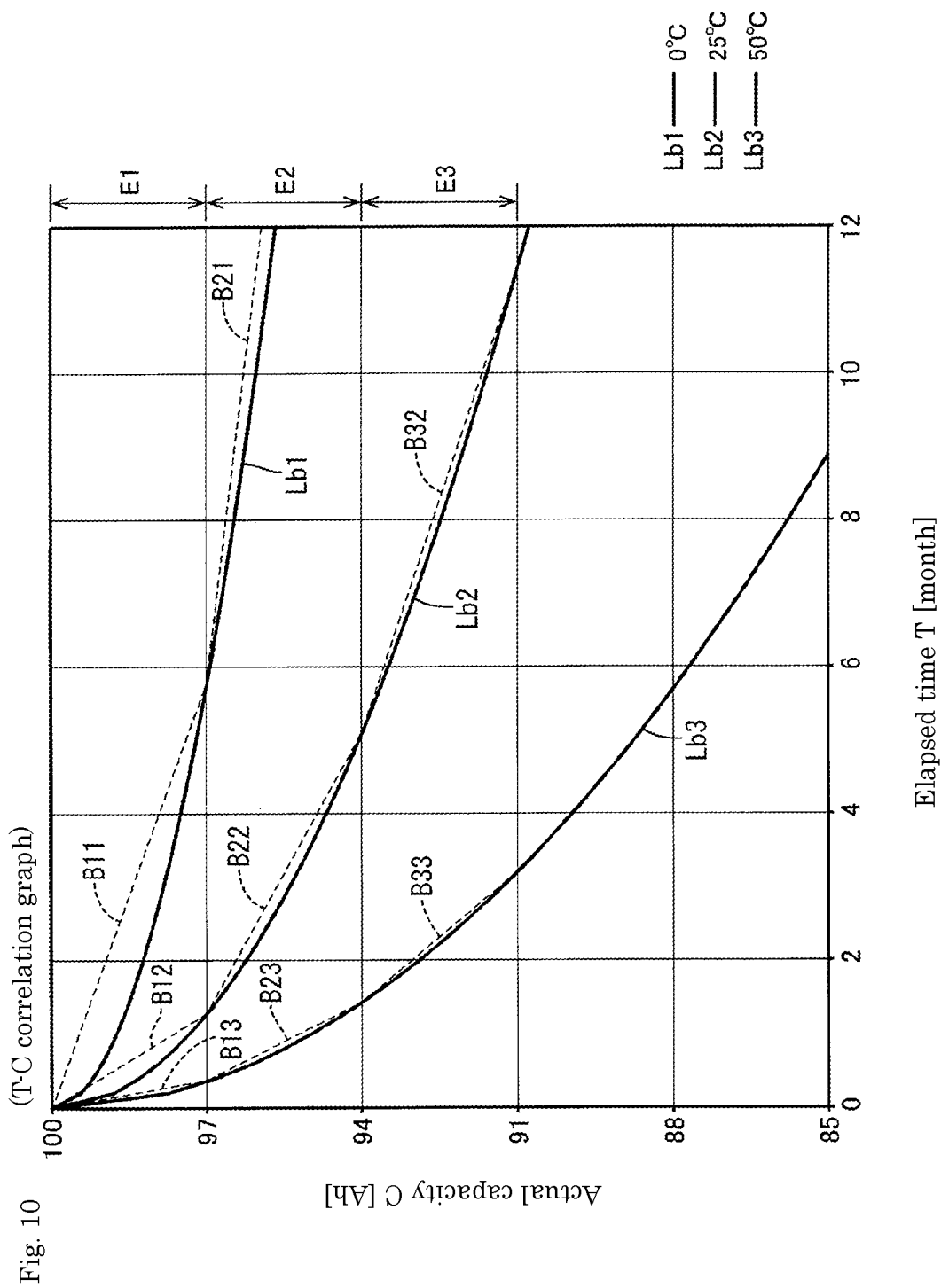
FIG. 10 is a graph showing a capacity change curve of the secondary battery.

FIG. 10 is a T-C correlation graph of the lithium ion secondary battery 31 with the elapsed time T on the horizontal axis (X-axis) and the actual capacity C on the vertical axis (Y-axis). A capacity change curve Lb represents a transition of the actual capacity C with respect to the elapsed time T. The capacity change curve Lb is an inverted curve obtained by folding back the capacity change curve La shown in FIG. 4 on the X-axis and is a root curve with respect to the elapsed time T similarly to the capacity change curve La.

Two straight lines B11 and B21 are straight lines that approximate a capacity change curve Lb1 by dividing the capacity change curve Lb1 into two areas E1 and E2.

Three straight lines B12 to B32 are straight lines that approximate a capacity change curve Lb2 by dividing the capacity change curve Lb2 into the three areas E1 to E3.

Three straight lines B13 to B33 are straight lines that approximate a capacity change curve Lb3 by dividing the capacity change curve Lb3 into the three areas E1 to E3.

Similarly to the capacity decrease amount map MA of FIG. 6, a capacity decrease amount map MB is data in which the decrease amount Y of the actual capacity C per unit time is stored for each of the areas E1 to E3 dividing the capacity change curve Lb and for each of the battery temperatures. The battery 20 holds data of the capacity decrease amount map MB in the memory 73.

The CPU 71 can calculate the decrease amount Y of the actual capacity C per predetermined time by using the capacity decrease amount map MB. The CPU 71 can calculate a current value Ct of the actual capacity C by subtracting the calculated decrease amount Y of the actual capacity C from a previous value of the actual capacity C.

4. Temperature Correction by Coefficient k

Figure 11:
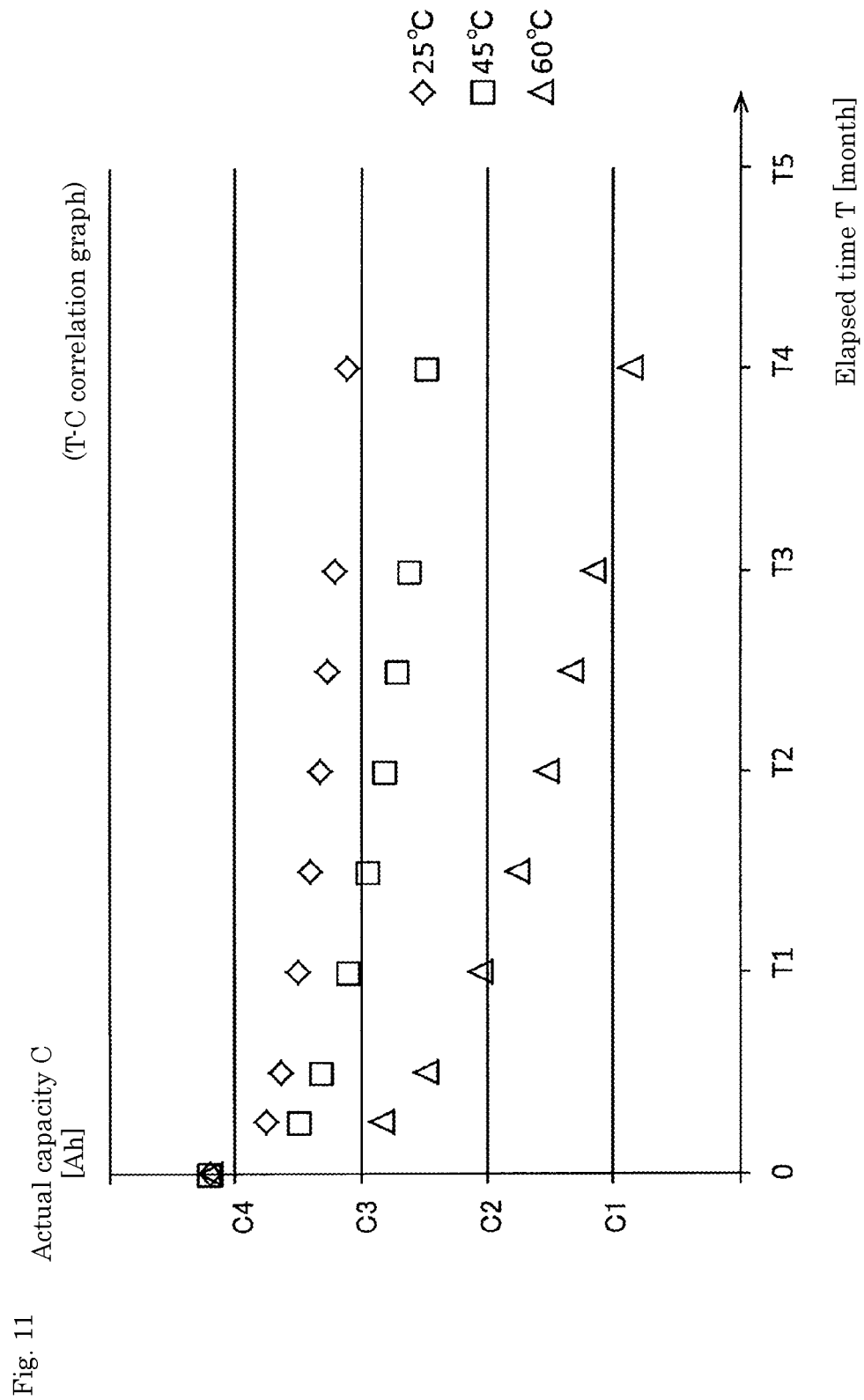
FIG. 11 shows a transition of the actual capacity at each battery temperature.

FIG. 11 is a T-C correlation graph of the lithium ion secondary battery 31 with the elapsed time T on the horizontal axis and the actual capacity C on the vertical axis. The actual capacity C decreases with the lapse of time after the manufacturing of the battery. The higher the battery temperature, the more remarkable the capacity decrease. That is, the higher the battery temperature, the more "accelerate" the decrease in the actual capacity C.

Figure 12:
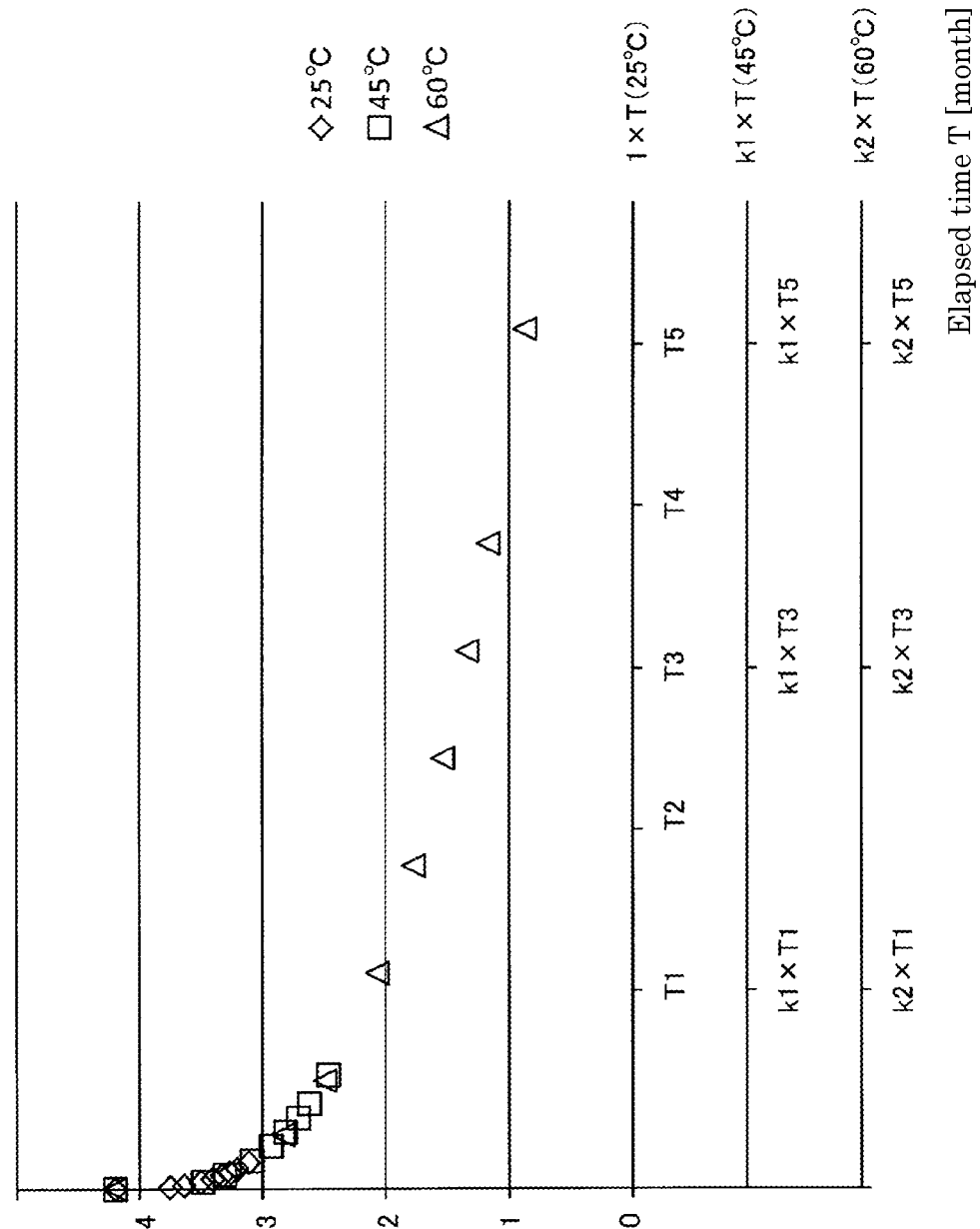
FIG. 12 shows a transition of the actual capacity at each battery temperature when the horizontal axis (time axis) is multiplied by a coefficient.

FIG. 12 is a T-C correlation graph of the lithium ion secondary battery 31 with the elapsed time T on the horizontal axis and the actual capacity C on the vertical axis. The horizontal axis (X-axis) is changed for each of the battery temperatures of 25 [° C.], 45 [° C.], and 60 [° C.], where the battery temperature of 45 [° C.] is multiplied by "k1" on the horizontal axis and the battery temperature of 60 [° C.] is multiplied by "k2" on the horizontal axis with respect to the battery temperature of 25 [° C.]. Note that k2>k1>1 holds.

When the horizontal axis (time axis) is multiplied by the "coefficient k", the transition of the actual capacity C substantially coincides even if the battery temperature is different. This means that "one hour" at the battery temperature of 45 [° C.] corresponds to "k1×1 hour" at a battery temperature of 25 [° C.]. That is, the decrease amount of the actual capacity C per "one hour" in the case of the battery temperature of 45 [° C.] corresponds to the decrease amount of the actual capacity C per "k1×1 hour" when converted to the amount in the case of the battery temperature of 25 [° C.].

The coefficient k with respect to the battery temperature can be calculated by the following steps:

(A) determining a value of N such that the Nth root of the elapsed time T and the actual capacity C of each battery temperature have a proportional relationship;

(B) determining a linear approximation equation of the actual capacity C for each battery temperature;

(C) determining a ratio M of the slope to a linear approximation equation of a reference temperature for the linear approximation equation of each battery temperature; and (D) calculating the coefficient k from the values of N and M.

A calculation example of the coefficient k at each of the battery temperatures of 40 [° C.] and 60 [° C.] with 25 [° C.] as the reference temperature is shown below.

The correlation between the Nth root of the elapsed time T and the actual capacity C is examined while the multiplier N is changed, and the value of N that is substantially proportional to the battery temperatures of 25 [° C.], 45 [° C.], and 60 [° C.] is specified.

Figure 13:
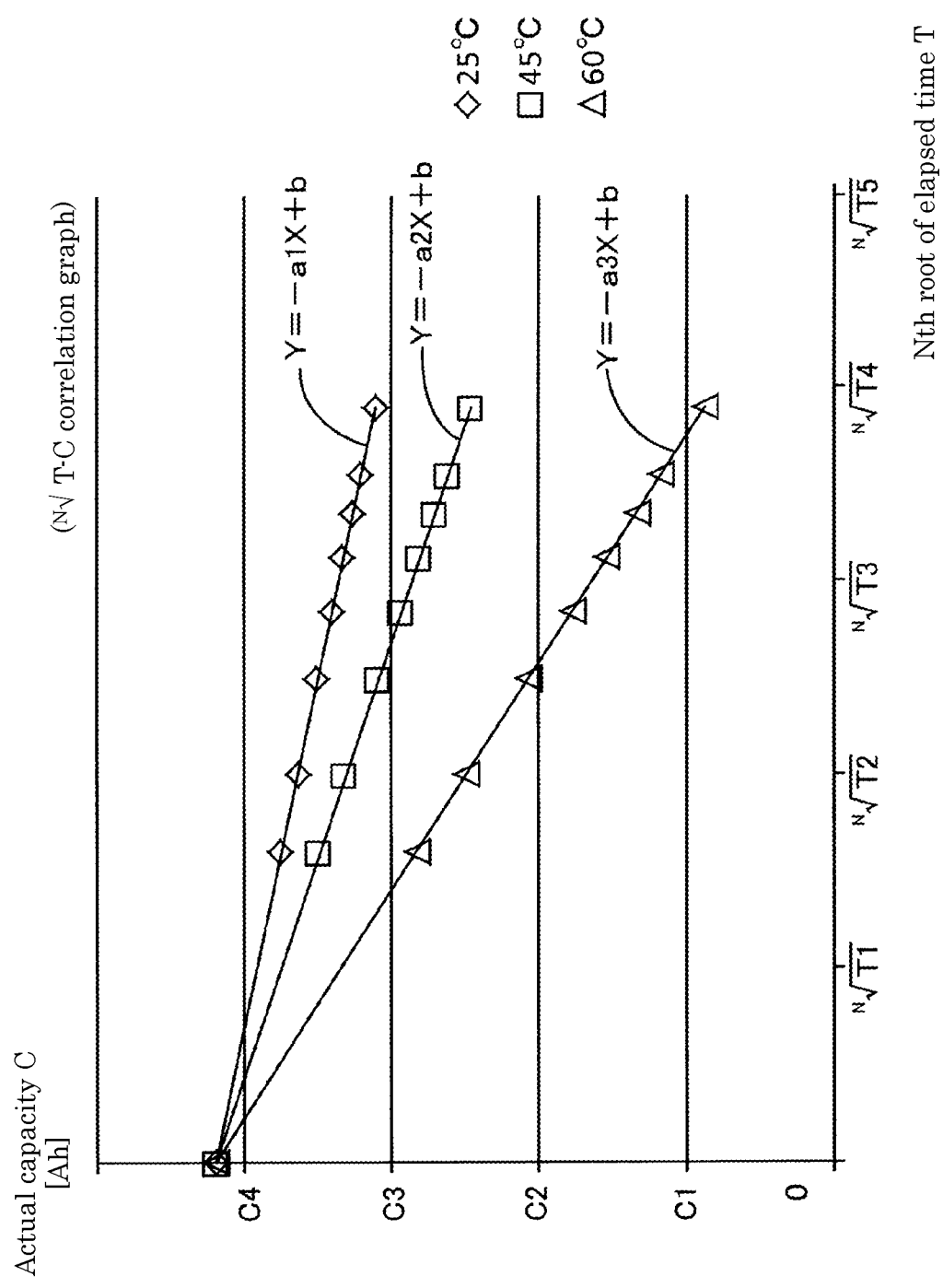
FIG. 13 shows a transition of the actual capacity at each battery temperature when the horizontal axis (time axis) is 1/N power of an elapsed time T.

FIG. 13 is an N√T-C correlation graph of the iron phosphate-based lithium ion secondary battery 31 with the Nth root of the elapsed time T on the horizontal axis and the actual capacity C on the vertical axis, and a transition of the actual capacity C is indicated by a straight line at each of battery temperatures of 25 [° C.], 45 [° C.], and 60 [° C.]. The value of N is, for example, "3.1215".

From FIG. 13, the linear approximation equation of the actual capacity C at each battery temperature can be obtained as follows.

$$Y = -a1X + b \quad (1)$$

$$Y = -a2X + b \quad (2)$$

$$Y = -a3X + b \quad (3)$$

Note that (1) is the linear approximation equation of the actual capacity C at a battery temperature of 25 [° C.], (2) is the linear approximation equation of the actual capacity C at a battery temperature of 45 [° C.], and (3) is the linear approximation equation of the actual capacity C at a battery temperature of 60 [° C.].

Next, from the linear approximation equations (1) to (3), the ratio M of the slope to the linear approximation equation of the reference temperature is determined for the linear approximation equation of each battery temperature.

The ratio M of the slope at each battery temperature is as follows:

$$M_{45° C.} = a2/a1 \quad (4)$$

$$M_{60° C.} = a3/a1 \quad (5)$$

Since the values of N and M can be obtained as described above, the coefficient k can be obtained for each of the battery temperatures of 45 [° C.] and 60 [° C.] by Equation (6) below:

$$k = M^N \quad (6)$$

The higher the battery temperature, the larger the coefficient k. In the present example, the reference temperature is 25 [° C.], and the coefficient k is one or less when the battery temperature is lower than 25 [° C.], and the coefficient k is one or more when the battery temperature is higher than 25 [° C.]. Therefore, $k1 < k2 < 1$, and $1 < k3 < k4 \ldots k8 < k9$.

As shown in FIG. 14, a coefficient table is data in which the coefficient k is stored in association with the battery temperature. The battery 20 holds data of the coefficient table in the memory 73.

Figure 15:
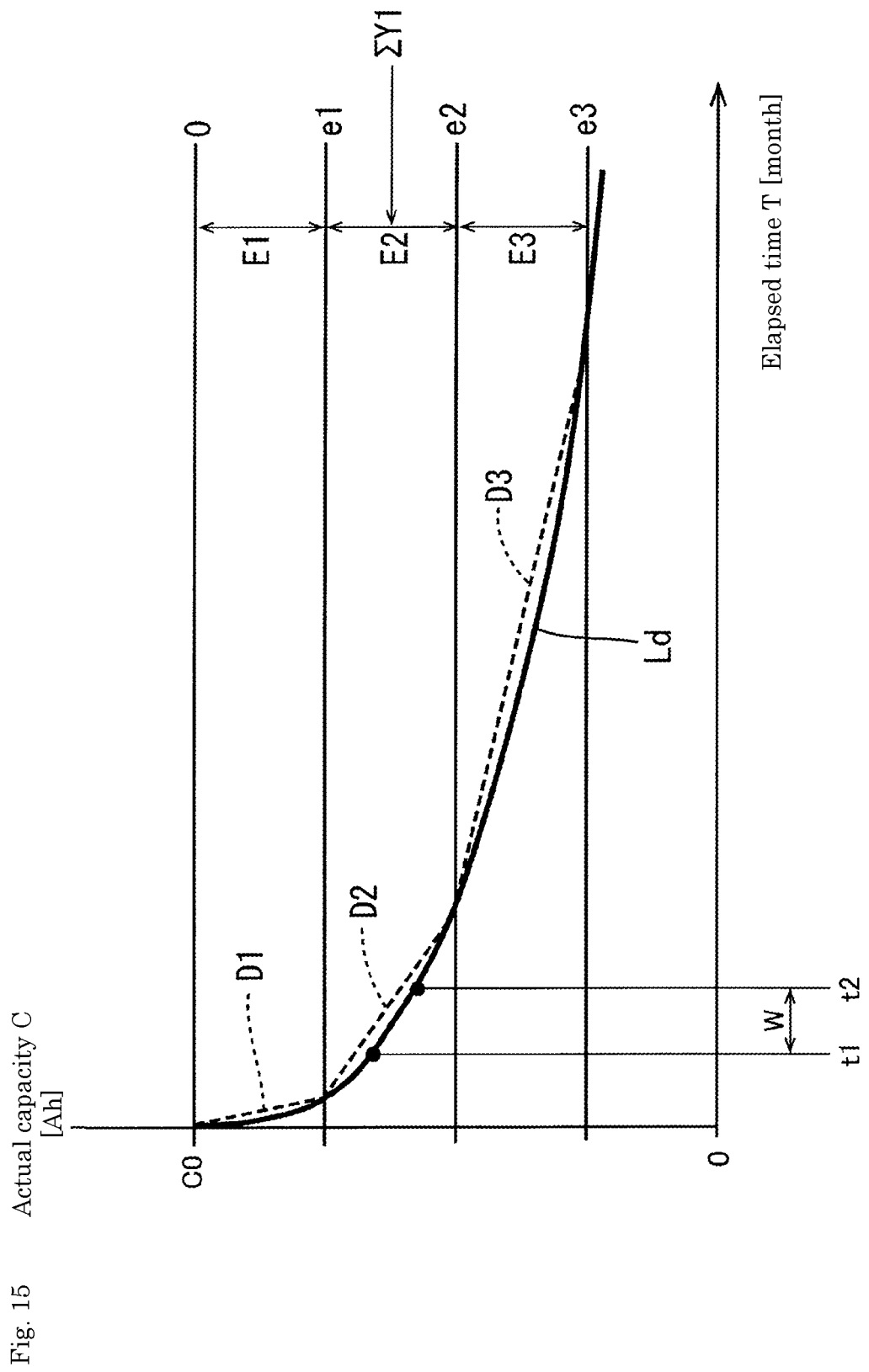
FIG. 15 shows a transition of the actual capacity at a reference temperature.

FIG. 15 is a T-C correlation graph of the iron phosphate-based lithium ion secondary battery 31 with the elapsed time T on the horizontal axis (X-axis) and the actual capacity C on the vertical axis (Y-axis). A capacity change curve Ld indicates a transition of the actual capacity C at the reference temperature 25 [° C.].

Three straight lines D1 to D3 are straight lines that approximate the capacity change curve Ld by dividing the capacity change curve Ld into three areas E1 to E3.

The memory 73 holds data of slopes d1 to d3 of the three approximate lines D1 to D3 together with the coefficient table (see FIGS. 14 and 16).

The CPU 71 of the control unit 70 estimates the actual capacity C in five steps (A) to (E):

(A) calculating a slope d of an approximate line D at the reference temperature corresponding to the actual capacity C;
(B) calculating the coefficient k corresponding to the battery temperature;
(C) correcting a predetermined time W;
(D) calculating a decrease amount Yw of the actual capacity c per predetermined time W; and
(E) calculating the total decrease amount ΣY of the actual capacity C.

Hereinafter, an estimation example of the actual capacity C will be described with reference to FIGS. 14 to 16. Here, an initial value of the actual capacity C, the total decrease amount of the actual capacity at the time of the previous estimation (the total decrease amount from the initial value), and the battery temperature are set to the following conditions.

The initial value of the actual capacity C is C0. A total decrease amount ΣY1 of the actual capacity C at a previous estimation time t1 is in a range of $e1 < \Sigma Y1 < e2$. In the following example, the decrease amount Y of the actual capacity C per predetermined time W from the previous estimation time t1 is calculated. In the predetermined time W, the battery temperature of the secondary battery 31 detected by the temperature sensor 43 is 40 [° C.].

The slope d of the approximate line D at the reference temperature corresponding to the actual capacity C can be obtained from the total decrease amount ΣY1 of the actual capacity C at the previous estimation time t1 and the data of FIG. 16. In this example, the total decrease amount ΣY1 at the previous estimation time t1 is in a range of $e1 < \Sigma Y1 < e2$. Therefore, from FIG. 16, the approximate line at the reference temperature corresponding to the actual capacity C is D2, and the slope of the approximate line is "d2".

The coefficient k for temperature correction can be acquired by referring to the battery temperature of the secondary battery 31 measured by the temperature sensor 43 in the coefficient table. When the battery temperature is 40 [° C.], the coefficient is "k5".

In processing of performing temperature correction on the predetermined time W, the predetermined time W is multiplied by the coefficient k as expressed in Equation (7) below:

$$Wt = k \times W \quad (7)$$

Wt is a time obtained by converting a predetermined time elapsed at the battery temperature of the secondary battery 31 into an elapsed time at the reference temperature.

By multiplying the conversion time Wt by the slope d of the approximate line D, the decrease amount Yw of the actual capacity C can be calculated as expressed by Equation (8) below:

$$Yw = (k \times W) \times d \quad \text{Equation (8)}$$

A total decrease amount ΣY2 of the actual capacity C at a time t2 can be calculated by adding the calculated decrease amount Yw of the actual capacity C to the total decrease amount ΣY1 of the actual capacity C at the previous estimation time t1. Then, the actual capacity C at the time t2 can be estimated by subtracting the total decrease amount ΣY2 from the initial value C0 of the actual capacity C as expressed in Equation (9) below:

$$C = C0 - \Sigma Y2 \quad \text{Equation (9)}$$

The CPU 71 performs the above processing every predetermined time (unit time) to estimate the actual capacity C. The temperature correction for the predetermined time W by using the coefficient k is to correct the decrease amount Yw of the actual capacity C per predetermined time W.

The CPU 71 calculates a capacity retention ratio SOH1 from an estimation result of the actual capacity C. The capacity retention ratio SOH1 is a ratio between the initial value C0 and the current value Ct of the actual capacity C and is a change rate of the actual capacity C, as expressed by Equation (10). The capacity retention ratio SOH1 indicates the degradation amount of the actual capacity C of the secondary battery 31.

$$SOH1 = (Ct/C0) \times 100[\%] \quad \text{(Equation 10)}$$

C0 is the initial value of the actual capacity C, and Ct is the current value of the actual capacity C.

5. Change in Degradation Area and Bending Point

Figure 17:
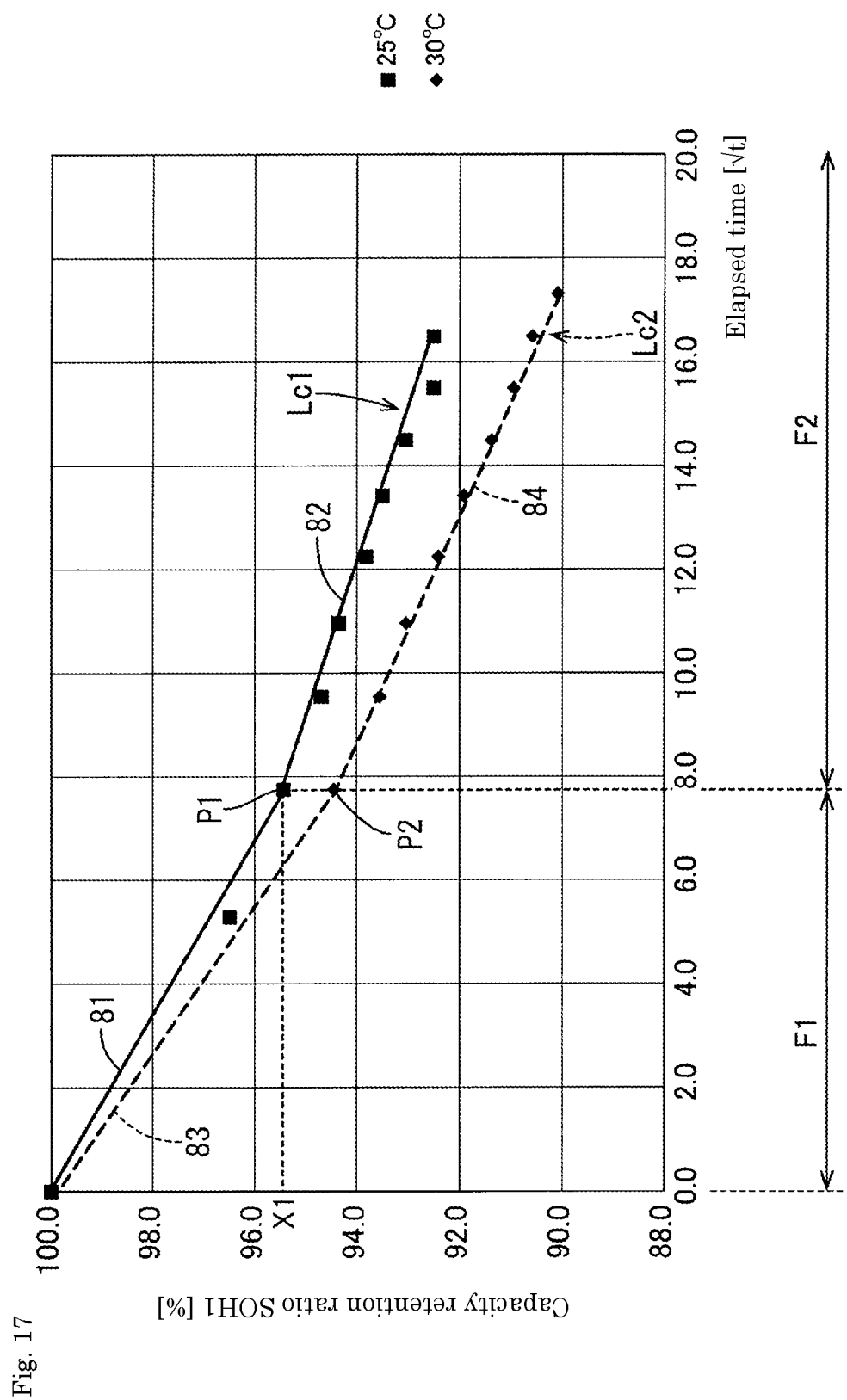
FIG. 17 is an approximate line of a capacity retention ratio.
Figure 18:
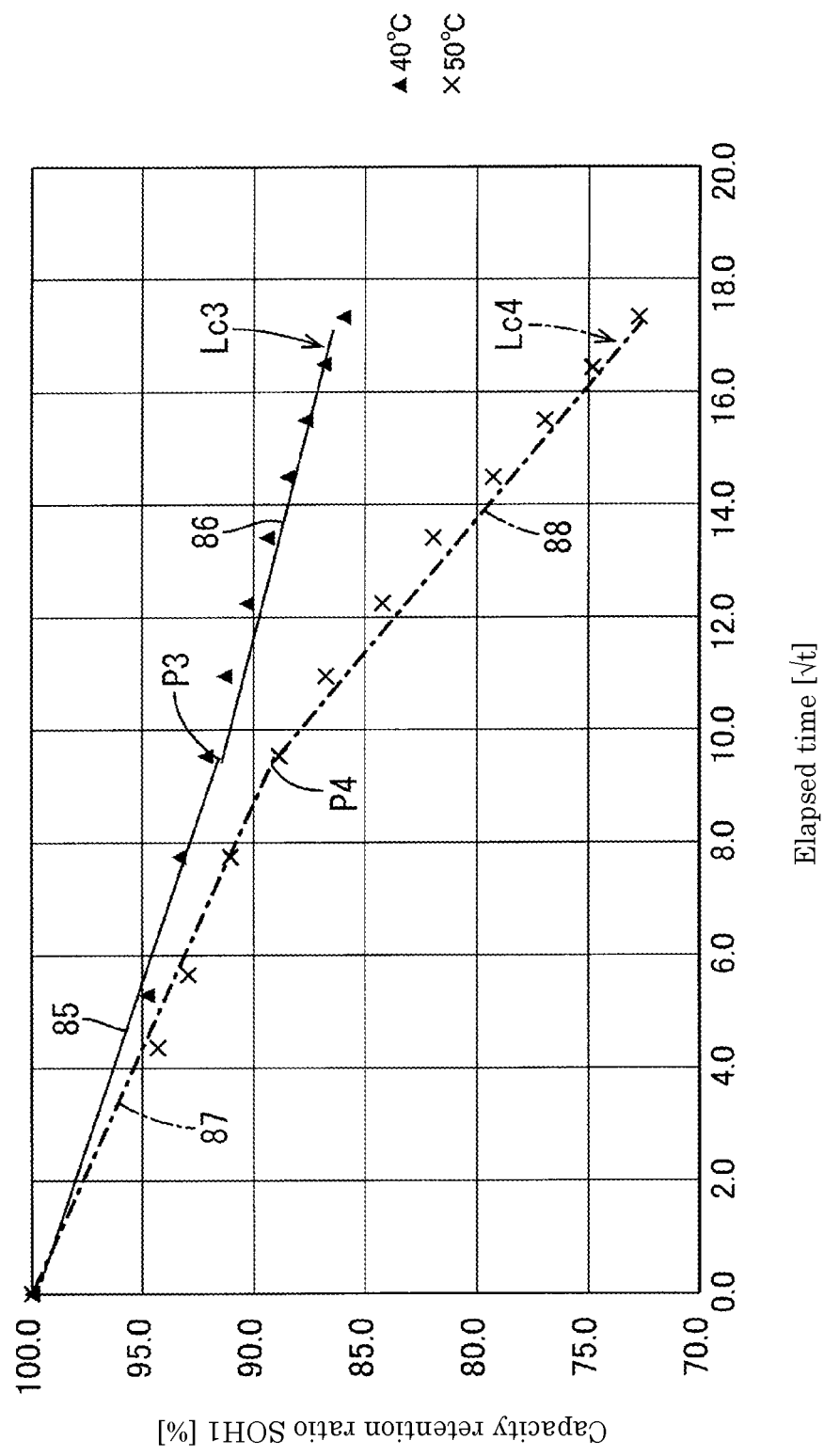
FIG. 18 is an approximate line of the capacity retention ratio.

FIGS. 17 and 18 are $\sqrt{T}$-SOH1 correlation graphs of the lithium ion secondary battery 31 with the root of the elapsed time T on the horizontal axis and the capacity retention ratio SOH1 on the vertical axis.

Lc1 to Lc4 are approximate lines of the capacity retention ratio SOH1. Lc1 is an approximate line at a battery temperature of 25 [° C.], and Lc2 is an approximate line at a battery temperature of 30 [° C.]. Lc3 is an approximate line at a battery temperature of 40 [° C.], and Lc4 is an approximate line at a battery temperature of 50 [° C.].

An approximate line Lc1 of the reference temperature has a first straight line 81 and a second straight line 82. The first straight line 81 and the second straight line 82 have different slopes, and the approximate line Lc1 has a bending point P1.

The approximate line Lc2 at 30° C. includes a first straight line 83 and a second straight line 84. The first straight line 83 and the second straight line 84 have different slopes, and the approximate line Lc2 has a bending point P2.

The approximate line Lc3 at 40° C. includes a first straight line 85 and a second straight line 86. The first straight line 85 and the second straight line 86 have different slopes, and the approximate line Lc3 has a bending point P3.

The approximate line Lc4 at 50° C. includes a first straight line 87 and a second straight line 88. The first straight line 87 and the second straight line 88 have different slopes, and the approximate line Lc4 has a bending point P4.

One of causes of appearance of the bending point P is a change in degradation factor. It can be inferred that there are a plurality of factors that cause aging degradation, such as generation of a film different from a solid electrolyte interphase (SEI), a change in a state of immersion in an electrode plate, runout of an additive, and stagnation of gas due to an increase in distance between electrode plates, and that the degradation factor has changed due to aging degradation.

As described above, the lithium ion secondary battery 31 may have two degradation areas F1, F2 depending on the elapsed time T. The first degradation area F1 is an area from the initial state (capacity retention ratio 100%) to the bending point P1 at a battery temperature of 25° C., and the second degradation area F2 is an area after the bending point P1 at the battery temperature of 25° C.

When the plurality of degradation areas F1, F2 are provided, the capacity change curve Ld may be divided for each degradation area and approximated by a straight line.

Figure 19:
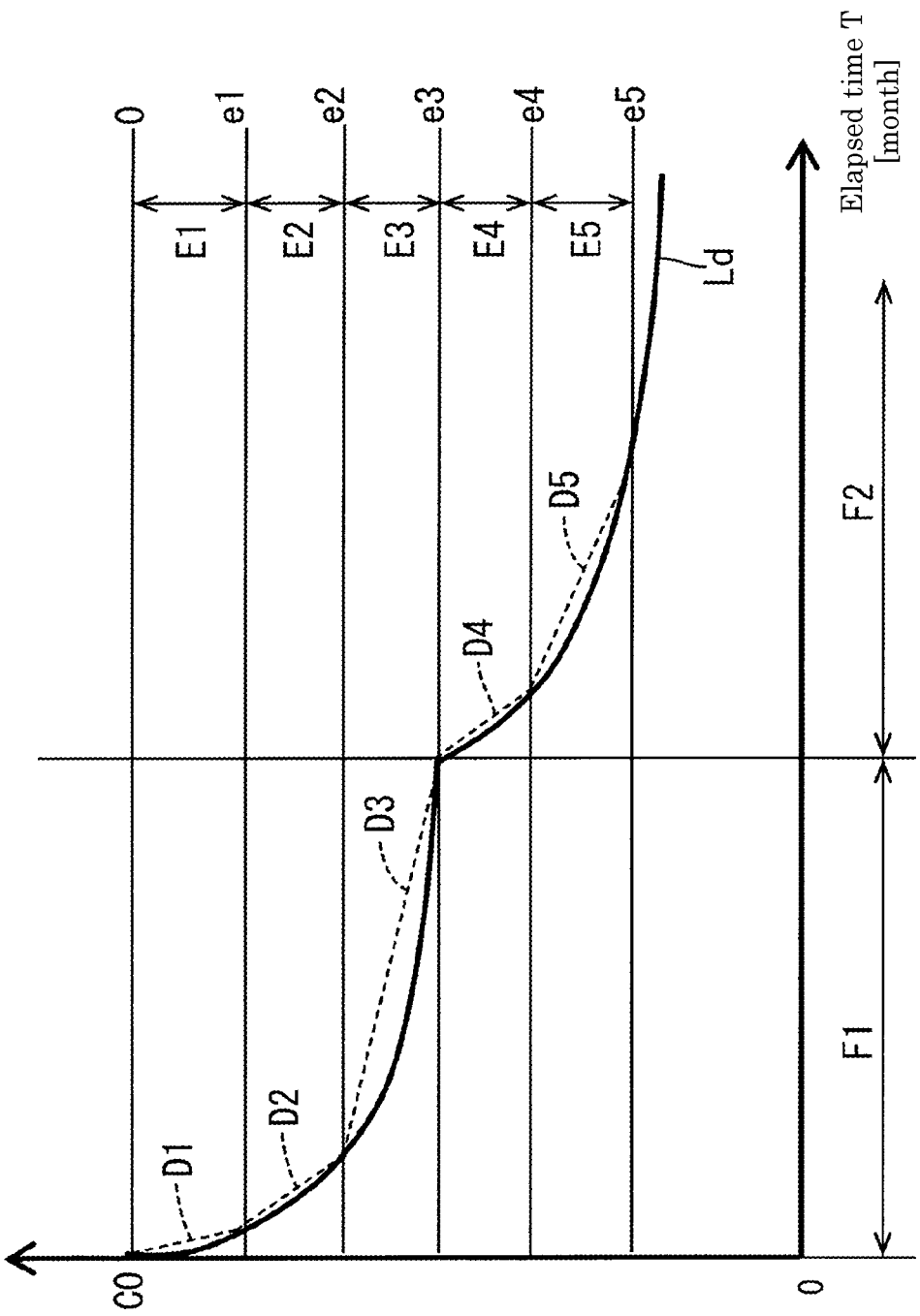
FIG. 19 is a capacity change curve of the secondary battery.

As shown in FIG. 19, the three straight lines D1, D2, D3 are straight lines approximating the first degradation area F1 of the capacity change curve Ld by dividing the first degradation area F1 into the three areas E1, E2, E3. Two straight lines D4, D5 are straight lines approximating the second degradation area F2 of the capacity change curve Ld by dividing the second degradation area F2 into two areas E4, E5.

As shown in FIG. 20A and FIG. 20B, the memory 73 holds first approximation data and second approximation data. The first approximation data is data of the slope d1 of the straight line D1, the slope d2 of the straight line D2, and the slope d3 of the straight line D3. The second approximation data is data of a slope d4 of the straight line D4 and a slope d5 of the straight line D5.

The first approximation data is first arithmetic data for calculating the capacity retention ratio SOH1 of the lithium ion secondary battery 31 for the first degradation area F1. The second approximation data is second arithmetic data for calculating the capacity retention ratio SOH1 of the lithium ion secondary battery 31 for the second degradation area F2.

When the plurality of degradation areas F1, F2 are provided, the coefficient table for temperature correction may be provided for each degradation area. As shown in FIG. 21A, a first coefficient table is data in which a first coefficient kA is stored in association with the battery temperature.

The first coefficient kA is a coefficient for temperature correction for the first degradation area F1. The first coefficient kA can be obtained from a ratio M1 of the slope of the first straight line. That is, the first coefficient kA can be obtained for each battery temperature by obtaining M1 and substituting M1 into Equation (6).

As shown in FIG. 21B, a second coefficient table is data in which a second coefficient kB is stored in association with the battery temperature. The second coefficient kB is a coefficient for temperature correction for the second degradation area F2. Similarly the second coefficient kB can be obtained from a ratio M2 of the slope of the second straight line.

The memory 73 holds the data of each of the first coefficient table and the second coefficient table.

The reason why the coefficient k for temperature correction is provided for each degradation area is that the ratio M may have a different value due to the difference in degradation area.

For example, when a comparison is made between 25° C. (reference temperature) and 30° C., a ratio $M1_{30°\ C.}$ of the slope of the first straight line 81 to the slope of the first straight line 83 and a ratio $M2_{30°\ C.}$ of the slope of the second straight line 82 to the slope of the second straight line 84 do not coincide with each other and have different values.

When a comparison is made between 25° C. (reference temperature) and 40° C., a ratio M140-c of the slope of the first straight line 81 to the slope of the first straight line 85 and a ratio $M2_{40°\ C.}$ of the slope of the second straight line 82 to the slope of the second straight line 86 do not coincide with each other and have different values.

The first coefficient table is first correction data for performing temperature correction on the capacity retention ratio SOH1 of the first degradation area F1, and the second coefficient table is second correction data for performing temperature correction on the capacity retention ratio SOH1 of the second degradation area F2.

Figure 22:
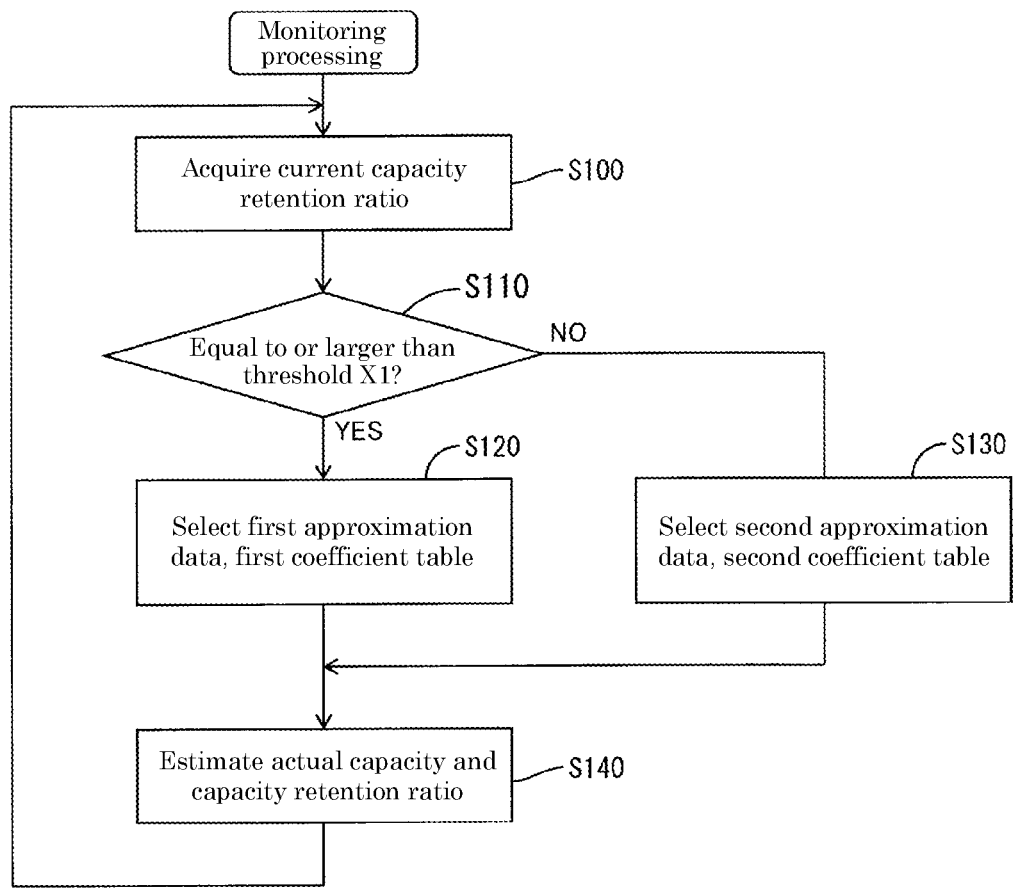
FIG. 22 is a flowchart of monitoring processing for the capacity retention ratio.

Hereinafter, monitoring processing for the capacity retention ratio SOH1 will be described with reference to a flowchart in FIG. 22. The CPU 71 acquires the current value of the capacity retention ratio SOH1 and compares the acquired value with a threshold X1 (S100, S110).

When the capacity retention ratio SOH1 is equal to or larger than the threshold X1 (S110: YES), it can be determined that the actual capacity C is included in the first degradation area F1. When the capacity retention ratio SOH1 is smaller than the threshold X1 (S110: NO), it can be determined that the actual capacity C is included in the second degradation area F2. S110 is determination processing of determining the degradation area.

In the case of the inclusion in the first degradation area F1, the CPU 71 selects the first approximation data from the memory 73 (S120).

For example, in the case where the actual capacity C is included in the area E1 of the first degradation area, the data of the slope d1 is acquired from the first approximation data. Then, from the slope d1 and the predetermined time W, the decrease amount Yw of the actual capacity C per predetermined time W is calculated by Equation (8). Further, the actual capacity C is estimated by Equation (9), and the capacity retention ratio SOH1 is estimated by Equation (10) (S140).

In the case where the actual capacity C is included in the second degradation area F2, the CPU 71 selects the second approximation data from the memory 73 (S130). For example, in the case where the actual capacity C is included in the area E4 of the second degradation area, the data of the slope d4 is acquired from the second approximation data.

Then, from the slope d4 and the predetermined time W, the decrease amount Yw of the actual capacity C per predetermined time W is calculated by Equation (8). Further, the actual capacity C is estimated by Equation (9), and the capacity retention ratio SOH1 is estimated by Equation (10) (S140).

S140 is estimation processing of selecting approximation data corresponding to the degradation area from the memory 73 to estimate the capacity retention ratio SOH1 of the lithium ion secondary battery 31.

The monitoring processing for the capacity retention ratio SOH1 (S110 to S140) is executed at predetermined time intervals (unit time) similarly to the estimation processing for the actual capacity C.

By determining the first degradation area F1 and the second degradation area F2 and selectively using the two pieces of approximation data, estimation accuracy of the actual capacity C and the capacity retention ratio SOH1 is improved.

In addition, the CPU 71 performs temperature correction on the predetermined time W by selectively using the two coefficient tables at the time of estimating the actual capacity C and the capacity retention ratio SOH1. That is, when the capacity retention ratio SOH1 is equal to or larger than the threshold X1, the CPU 71 selects the first coefficient table (S120). The CPU 71 acquires the first coefficient kA corresponding to the battery temperature from the first coefficient table and corrects the predetermined time W based on Equation (7).

When the capacity retention ratio SOH1 is smaller than the threshold X1, the CPU 71 selects the second coefficient table (S130). The CPU 71 acquires the second coefficient kB corresponding to the battery temperature from the second coefficient table and corrects the predetermined time W based on Equation (7).

Then, the CPU 71 estimates the actual capacity C and the capacity retention ratio SOH1 based on the corrected predetermined time W.

By determining the first degradation area F1 and the second degradation area F2 and selectively using the two coefficient tables, the estimation accuracy of the actual capacity C and the capacity retention ratio SOH1 is improved.

Second Embodiment

A resistance increase ratio SOH2 is a change rate of internal resistance R of the secondary battery 31 and is expressed by Equation (11). The resistance increase ratio SOH2 indicates the degradation amount of the internal resistance R of the secondary battery 31.

$$SOH2=(Rt-R0/R0)\times100[\%] \quad \text{Equation (11)}$$

R0 is an initial value of the internal resistance, and Rt is a current value of the internal resistance.

Figure 23:
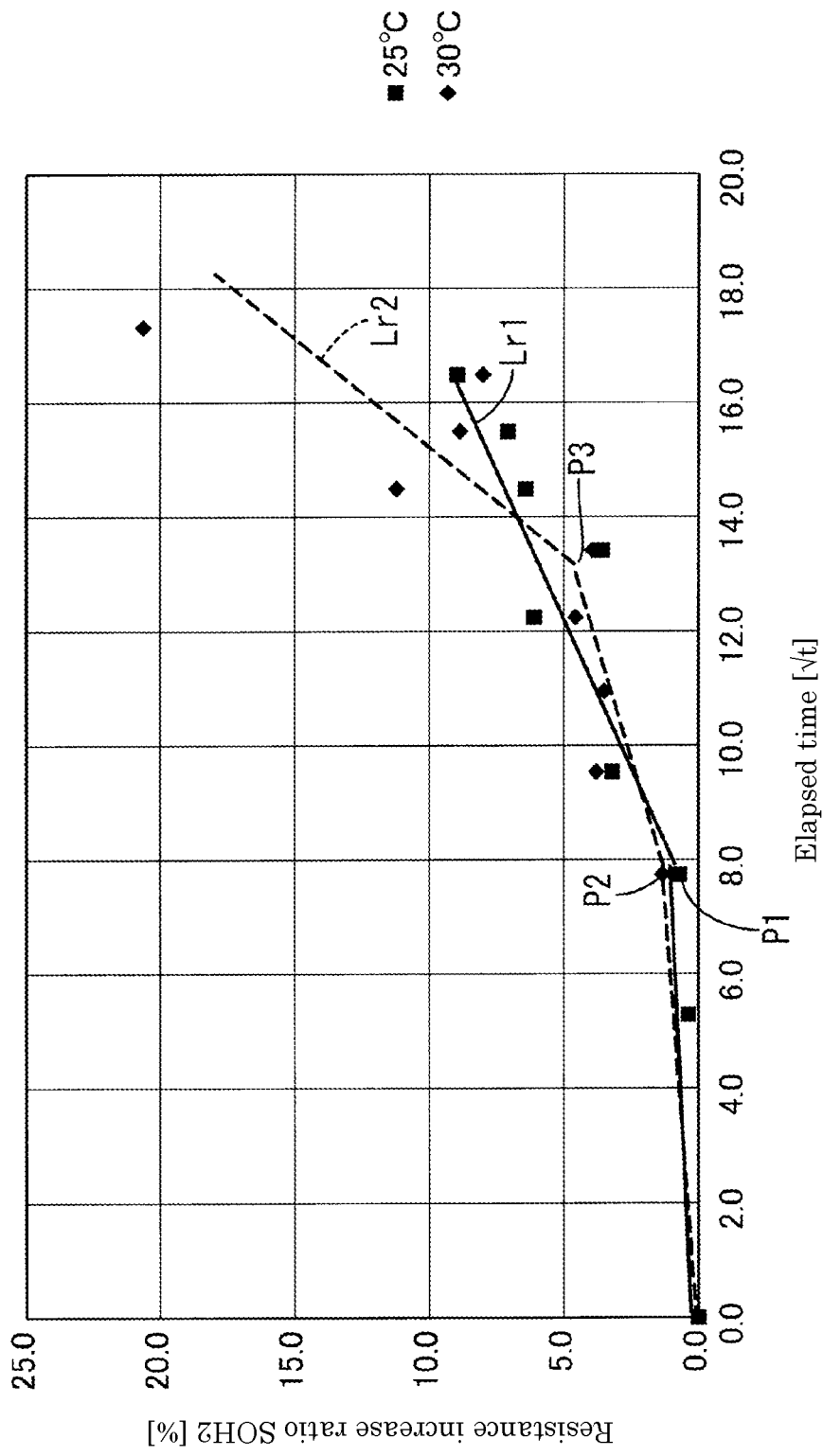
FIG. 23 is an approximate line of a resistance increase ratio.
Figure 24:
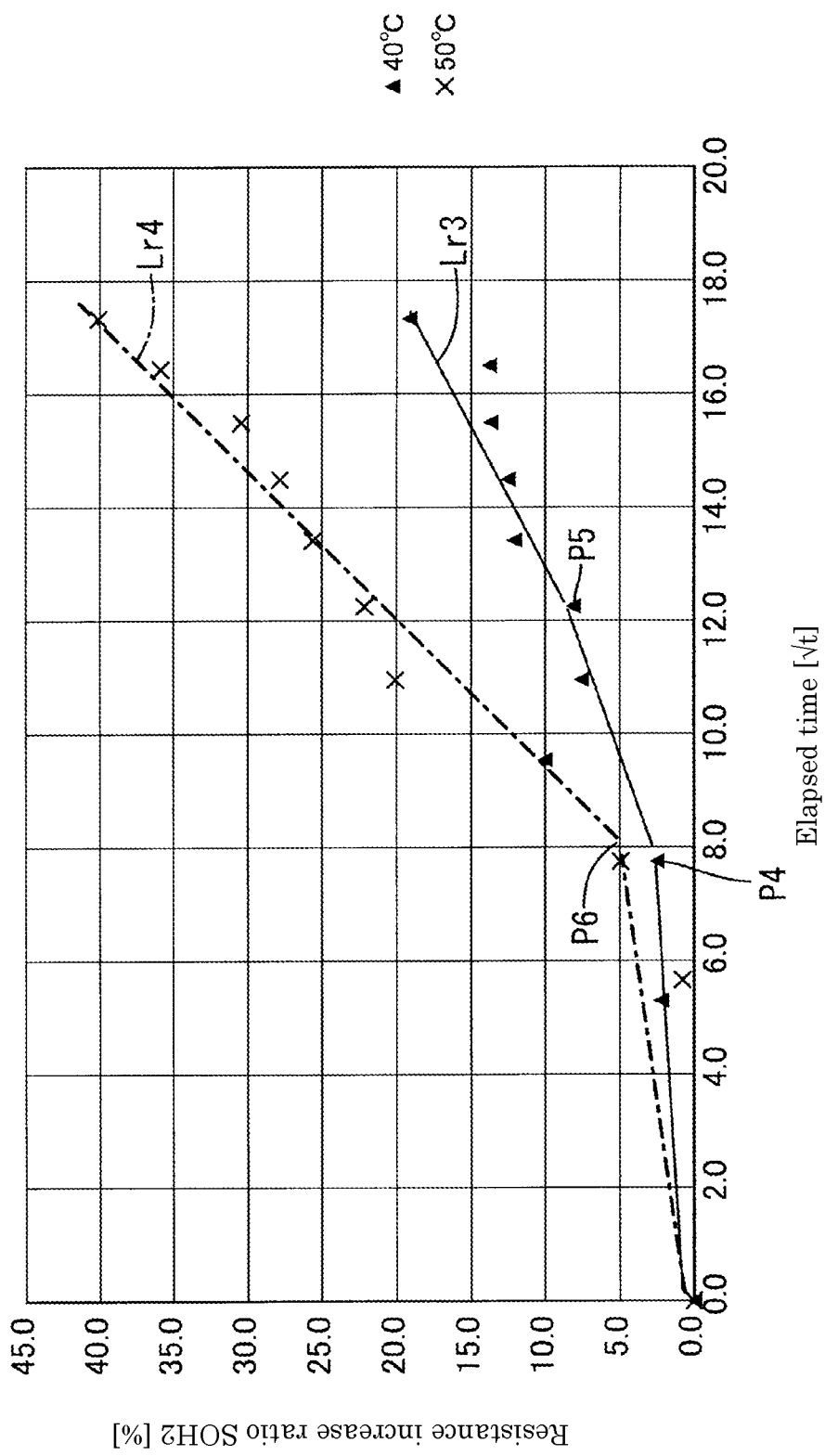
FIG. 24 is an approximate line of the resistance increase ratio.

FIGS. 23 and 24 are √T-SOH2 correlation graphs of the lithium ion secondary battery 31 with the root of the elapsed time T on the horizontal axis and the resistance increase ratio SOH2 on the vertical axis.

Lr1 to Lr4 are approximate lines of the resistance increase ratio SOH2. Lr1 is an approximate line at a battery temperature of 25 [° C.], and Lr2 is an approximate line at a battery temperature of 30 [° C.]. Lr3 is an approximate line at a battery temperature of 40 [° C.], and Lr4 is an approximate line at a battery temperature of 50 [° C.].

The approximate line Lr1 at the reference temperature (25° C.) has one bending point P1. The approximate line Lr2 at 30° C. has two bending points P2, P3.

The approximate line Lr3 at 40° C. has two bending points P4, P5. The approximate line Lr4 at 50° C. has one bending point P6.

Figure 25:
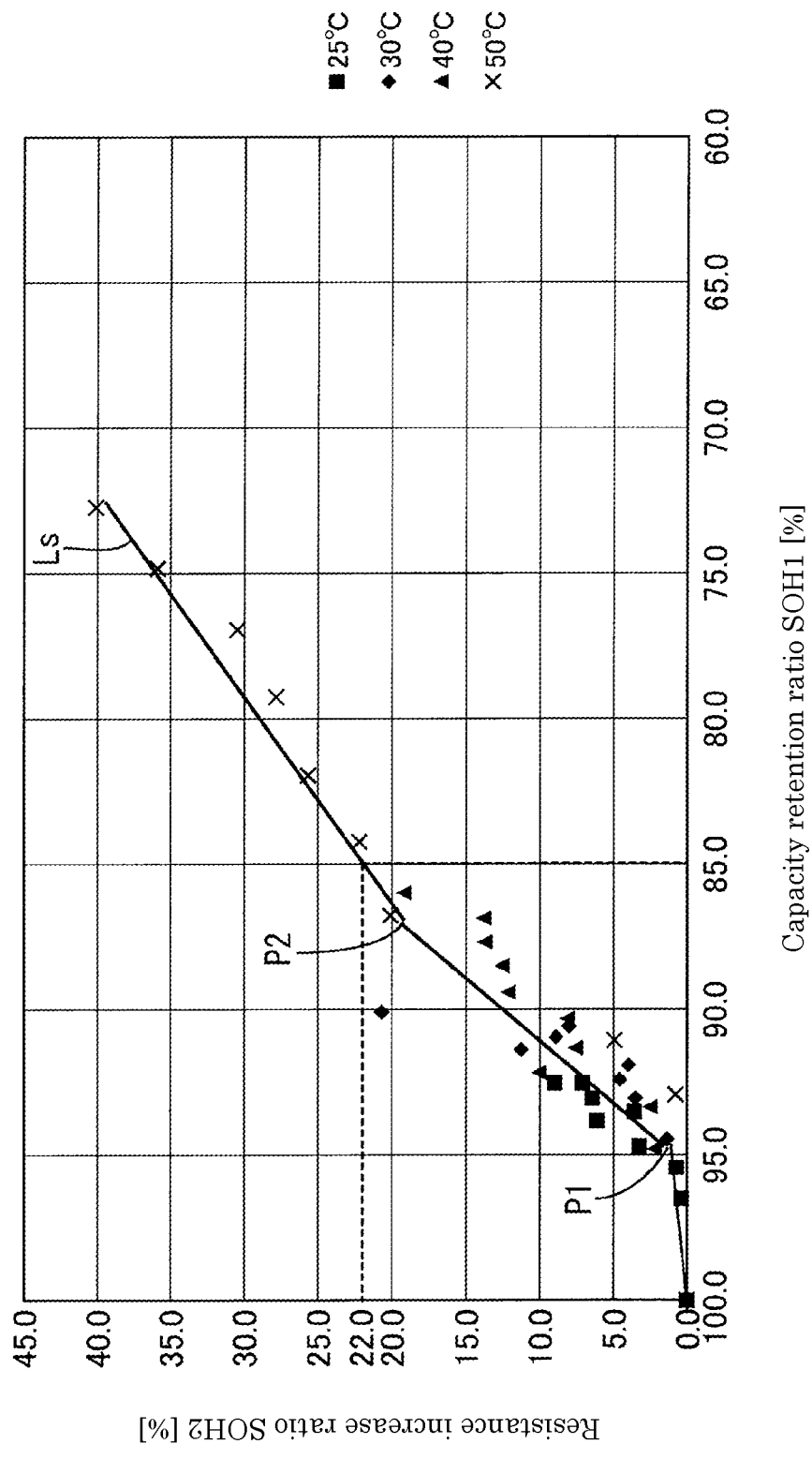
FIG. 25 is an approximate line showing the correlation between the capacity retention ratio and the resistance increase ratio.

FIG. 25 is an SOH1-SOH2 correlation graph with the capacity retention ratio SOH1 on the horizontal axis and a resistance increase ratio SOH2 on the vertical axis.

Ls is an approximate line indicating the correlation between SOH1 and SOH2. The approximate line Ls has two bending points P1, P2. The reason for having the two bending points P1, P2 is that an approximate line Lc of the capacity retention ratio SOH1 and an approximate line Lr of the resistance increase ratio SOH2 each have the bending point P.

The CPU 71 can estimate the resistance increase ratio SOH2 by referring to the capacity retention ratio SOH1 on the approximate line Ls indicating the correlation between SOH1 and SOH2. For example, when the capacity retention ratio SOH1 is 85 [%], the resistance increase ratio SOH2 is 22 [%].

Since the degradation amounts of the capacity and the resistance can be estimated, the degradation state of the lithium ion secondary battery 31 can be determined accurately.

Third Embodiment

In a third embodiment, the capacity retention ratio SOH1 of the secondary battery 31 is calculated based on the approximate line Lc1 shown in FIG. 17. The approximate line Lc1 indicates a change in the capacity retention ratio SOH1 with respect to the root of the elapsed time T at the battery temperature of 25° C. The approximate line Lc1 is a curved straight line including the two first straight lines 81 and second straight lines 82.

The memory 73 stores the data of the first straight line 81 and the data of the second straight line 82. The first straight line 81 is the first arithmetic data for calculating the capacity retention ratio SOH1 in the first degradation area F1, and the second straight line 82 is the second arithmetic data for calculating the capacity retention ratio SOH1 in the second degradation area F2.

The CPU 71 compares the current value of the capacity retention ratio SOH1 with the threshold X1 to determine the degradation area.

When the capacity retention ratio SOH1 is equal to or larger than the threshold X1, the inclusion in the first degradation area F1 can be determined, and when the capacity retention ratio SOH1 is smaller than the threshold X1, the inclusion in the second degradation area F2 can be determined.

In the case of the inclusion in the first degradation area F1, the CPU 71 acquires the data of the first straight line 81 from the memory 73 and estimates the capacity retention ratio SOH1. That is, the root is calculated from the elapsed time T, and the root is referred to in the data of the first straight line 81, whereby the capacity retention ratio SOH1 can be estimated.

In the case of the inclusion in the second degradation area F2, the CPU 71 acquires the data of the second straight line 82 from the memory 73 and estimates the capacity retention ratio SOH1. That is, the root is calculated from the elapsed time T, and the root is referred to in the data of the second straight line 82, whereby the capacity retention ratio SOH1 can be estimated.

By determining the degradation area and selecting the first straight line 81 and the second straight line 82, the estimation accuracy of the capacity retention ratio SOH1 is enhanced. The CPU 71 may determine the degradation area, select the coefficient table, and perform the temperature correction. By performing the temperature correction, an estimation error of the capacity retention ratio SOH1 can be reduced.

OTHER EMBODIMENTS

The present technique is not limited to the embodiments described in the above description and the drawings, but, for example, the following embodiments are included in the technical scope.

(1) In the first to third embodiments described above, the iron phosphate-based lithium ion secondary battery has been exemplified as an example of the "energy storage device". The present invention can be widely applied to any energy storage device having a characteristic that the transition of the degradation amount with respect to the elapsed time T follows the root law. For example, the present invention can also be applied to a ternary lithium ion secondary battery. The ternary lithium ion secondary battery is a battery in which a lithium-containing metal oxide which contains elements of Co, Mn, and Ni is used as a positive active material, and graphite, carbon, or the like is used as a negative active material. The present invention can also be applied to other secondary batteries such as lead-acid batteries, capacitors, and the like.

(2) In the first embodiment described above, the capacity retention ratio SOH1 of the secondary battery 31 has been estimated using the root law of the elapsed time T. The resistance increase ratio SOH2 of the secondary battery 31 may be estimated using the root law of the elapsed time T. The capacity retention ratio SOH1 indicates the capacity degradation amount of the secondary battery 31, and the resistance increase ratio SOH2 indicates the degradation amount of the resistance of the energy storage device 31.

(3) The present technique can be applied to an estimation program for the degradation amount of the energy storage device. The estimation program is a program for causing a computer to execute: the determination processing of determining the degradation area of the energy storage device (S110); and the estimation processing of selecting the first arithmetic data to estimate the degradation amount of the energy storage device when the degradation area is the first degradation area, and selecting the second arithmetic data to estimate the degradation amount of the energy storage device when the degradation area is the second degradation area (S140). The present technique can be applied to a recording medium in which the estimation program for estimating the degradation amount of the energy storage device is recorded. The computer is, for example, the CPU 71. The energy storage device is, for example, the secondary battery 31. The estimation program can be recorded in the recording medium such as read-only memory (ROM).

DESCRIPTION OF REFERENCE SIGNS

20: battery
30: assembled battery
31: secondary battery (example of "energy storage device" of present invention)
50: battery manager (example of "estimation apparatus" of present invention)
60: voltage detection circuit
70: control unit
71: CPU (example of "arithmetic processing unit" of present invention)
73: memory (example of "storage unit" of present invention)

The invention claimed is:

1. An estimation apparatus that estimates a degradation amount of an energy storage device, the estimation apparatus comprising:
a storage unit; and
an arithmetic processing unit,
wherein
the energy storage device has a characteristic of including a first degradation area in which a temporal transition of a degradation amount shows a first transition and a second degradation area in which the temporal transition of the degradation amount shows a second transition,
the storage unit holds
first arithmetic data for calculating the degradation amount of the energy storage device in the first degradation area, and
second arithmetic data for calculating the degradation amount of the energy storage device in the second degradation area, and
the arithmetic processing unit executes
determination processing of determining a degradation area of the energy storage device, and
estimation processing of selecting arithmetic data corresponding to the degradation area from the storage unit to estimate the degradation amount of the energy storage device, and
wherein
the storage unit holds
first correction data for performing temperature correction on the degradation amount of the energy storage device in the first degradation area, and
second correction data for performing temperature correction on the degradation amount of the energy storage device in the second area, and
the arithmetic processing unit selects correction data corresponding to the degradation area from the storage unit to correct the degradation amount of the energy storage device.

2. The estimation apparatus according to claim 1, wherein the first correction data is a coefficient table for performing temperature correction on an elapsed time of the energy storage device in the first degradation area, and the second correction data is a coefficient table for performing temperature correction on the elapsed time of the energy storage device in the second degradation area.

3. An estimation apparatus that estimates a degradation amount of an energy storage device, the estimation apparatus comprising:
a storage unit; and
an arithmetic processing unit,
wherein
the energy storage device has a characterisitics of including a first degradation area in which a temporal transition of a degradation amount shows a first transition and a second degradation area in which the temporal transition of the degradation amount shows a second transition, the storage unit holds first arithmetic data for calculating the degradation amount of the energy storage device in the first degradation area, and second arithmetic data for calculating, the degradation amount of the energy storage device in the second degradation area, the arithmetic processing unit executes determination processing of determining a degradation area of the energy storage device, and estimation processing of selecting arithmetic data corresponding to the degradation area from the storage unit to estimate the degradation amount of the energy storage device, and wherein the storage unit holds correlation data indicating a correlation between a capacity change rate and a resistance change rate of the energy storage device, and the arithmetic processing unit estimates one of the capacity change rate and the resistance change rate based on the first arithmetic data and the second arithmetic data, and estimates the other of the capacity change rate and the resistance change rate from the correlation data.

4. An estimation method for a degradation amount of an energy storage device, the energy storage device having a characteristic of including a first degradation area in which a temporal transition of a degradation amount shows a first transition and a second degradation area in which the temporal transition of the degradation amount shows a second transition, the method comprising:

determining a degradation area of the energy storage device;

selecting first arithmetic data to estimate the degradation amount of the energy storage device when the degradation area is a first degradation area, and selecting second arithmetic data to estimate the degradation amount of the energy storage device when the degradation area is a second degradation area; and selectin first correction data for performing temperature correction on the degradation amount of the energy storage device in the first degradation area, and selecting second correction data for performing temperature correction on the degradation amount of the energy storage device in the second degradation area.

* * * * *